United States Patent
Niitsuma

(10) Patent No.: US 9,432,011 B2
(45) Date of Patent: Aug. 30, 2016

(54) SEMICONDUCTOR INTEGRATED CIRCUIT, APPARATUS WITH SEMICONDUCTOR INTEGRATED CIRCUIT, AND CLOCK CONTROL METHOD IN SEMICONDUCTOR INTEGRATED CIRCUIT

(71) Applicant: CANON KABUSHIKI KAISHA, Tokyo (JP)

(72) Inventor: Hiroaki Niitsuma, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/856,253

(22) Filed: Sep. 16, 2015

(65) Prior Publication Data

US 2016/0087618 A1    Mar. 24, 2016

(30) Foreign Application Priority Data

Sep. 18, 2014   (JP) ................. 2014-190384

(51) Int. Cl.
| | |
|---|---|
| *G11C 8/00* | (2006.01) |
| *H03K 5/135* | (2006.01) |
| *G11C 11/4076* | (2006.01) |
| *H03K 5/00* | (2006.01) |

(52) U.S. Cl.
CPC .......... *H03K 5/135* (2013.01); *G11C 11/4076* (2013.01); *H03K 2005/00286* (2013.01)

(58) Field of Classification Search
CPC  H04B 1/707; G06F 17/5022; G06F 17/5045

USPC ....................... 365/233.11, 233.12
See application file for complete search history.

(56) References Cited

U.S. PATENT DOCUMENTS

| | | | | |
|---|---|---|---|---|
| 2006/0112295 A1* | 5/2006 | Shimoyama | ........ | G06F 13/4243 713/600 |
| 2010/0005214 A1* | 1/2010 | Trombley | ............ | G06F 13/405 710/310 |
| 2012/0310081 A1* | 12/2012 | Adler | ................... | A61B 5/0035 600/427 |

FOREIGN PATENT DOCUMENTS

JP           2012-99921 A       5/2012

* cited by examiner

*Primary Examiner* — Anthan Tran
(74) *Attorney, Agent, or Firm* — Canon USA, Inc. IP Division

(57) ABSTRACT

A semiconductor integrated circuit includes, a fixed frequency-division clock generation unit configured to generate a fixed frequency-division clock with a fixed frequency based on an output clock of a clock source, a variable frequency-division clock generation unit configured to generate a variable frequency-division clock with a variable frequency based on the output clock of the clock source, and a data path selection unit configured to select a data path. The data path selection unit selects a data path with or without a synchronization unit for converting the data into clock-synchronous data on a receiving side according to whether the variable frequency-division clock is or is not, respectively, generated by the variable frequency-division clock generation unit.

9 Claims, 16 Drawing Sheets

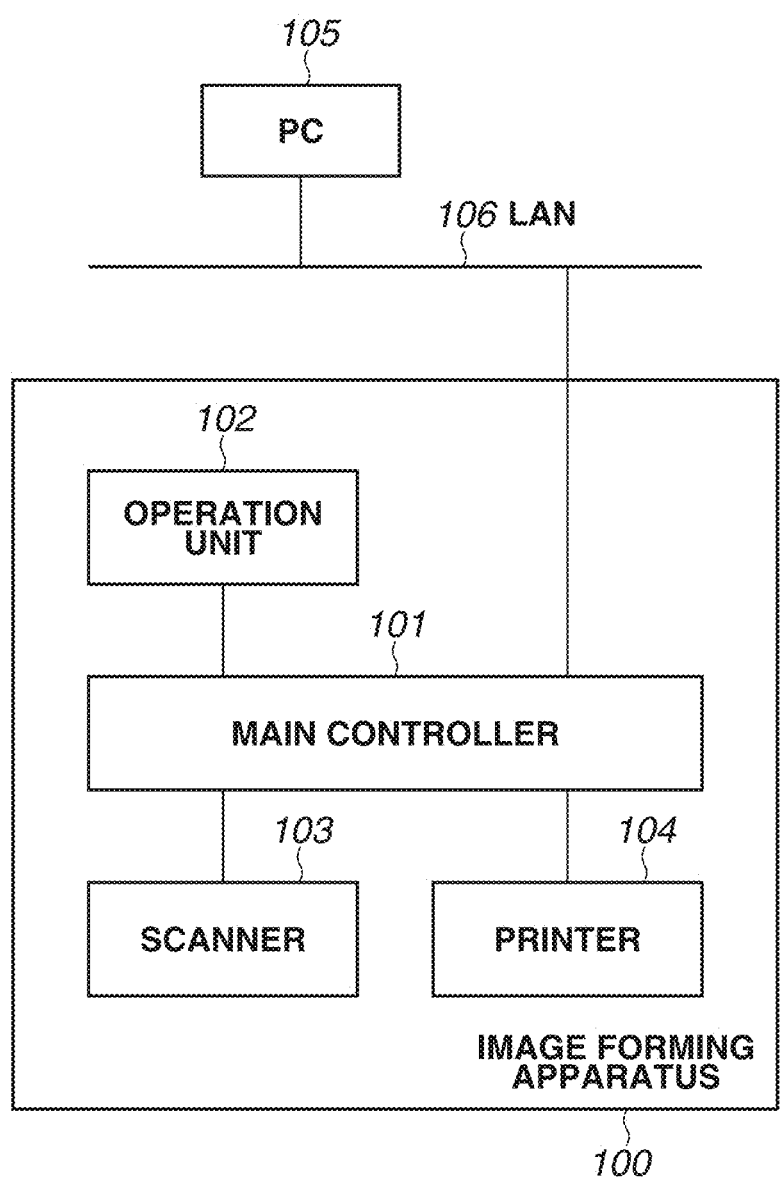

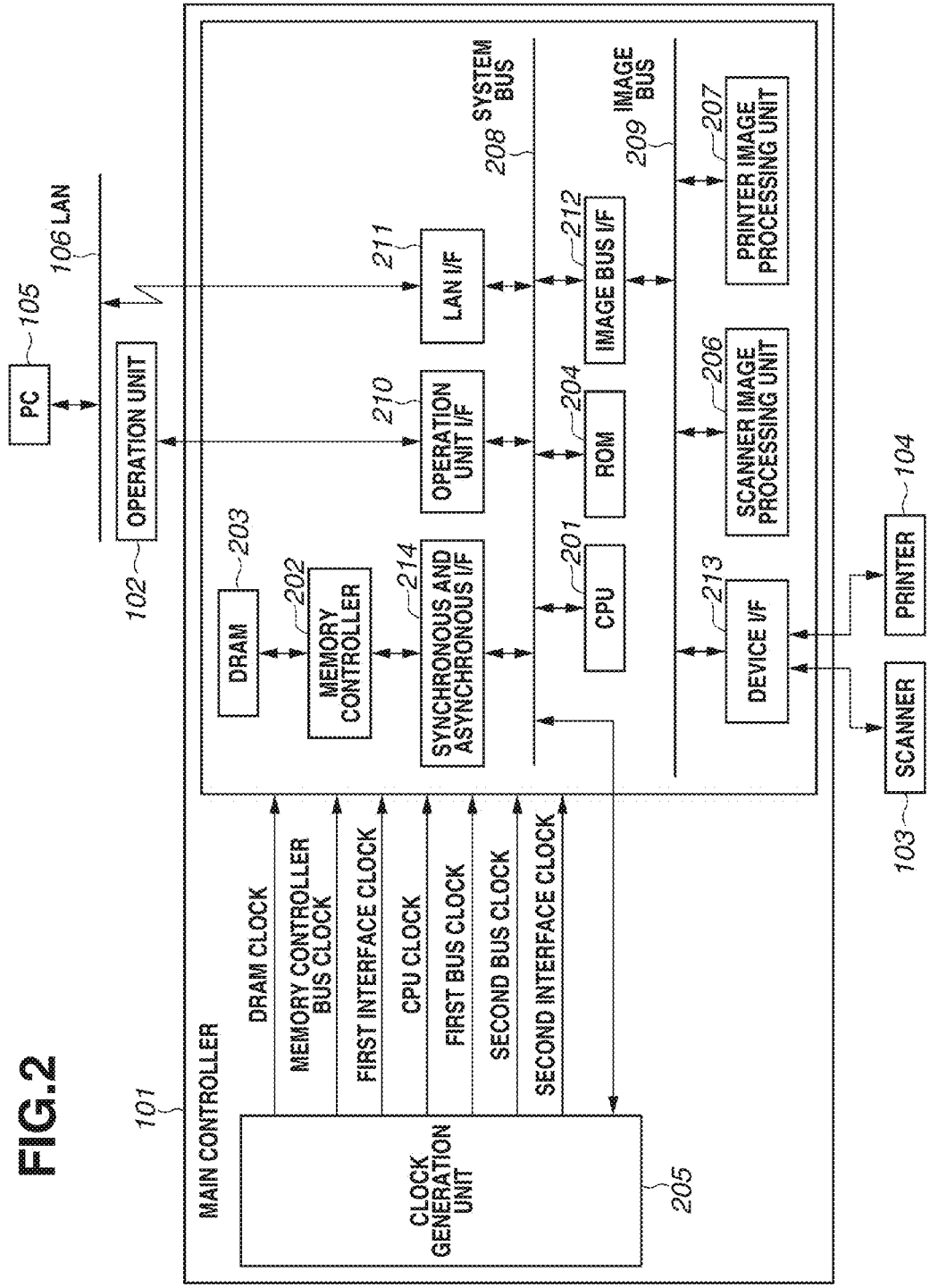

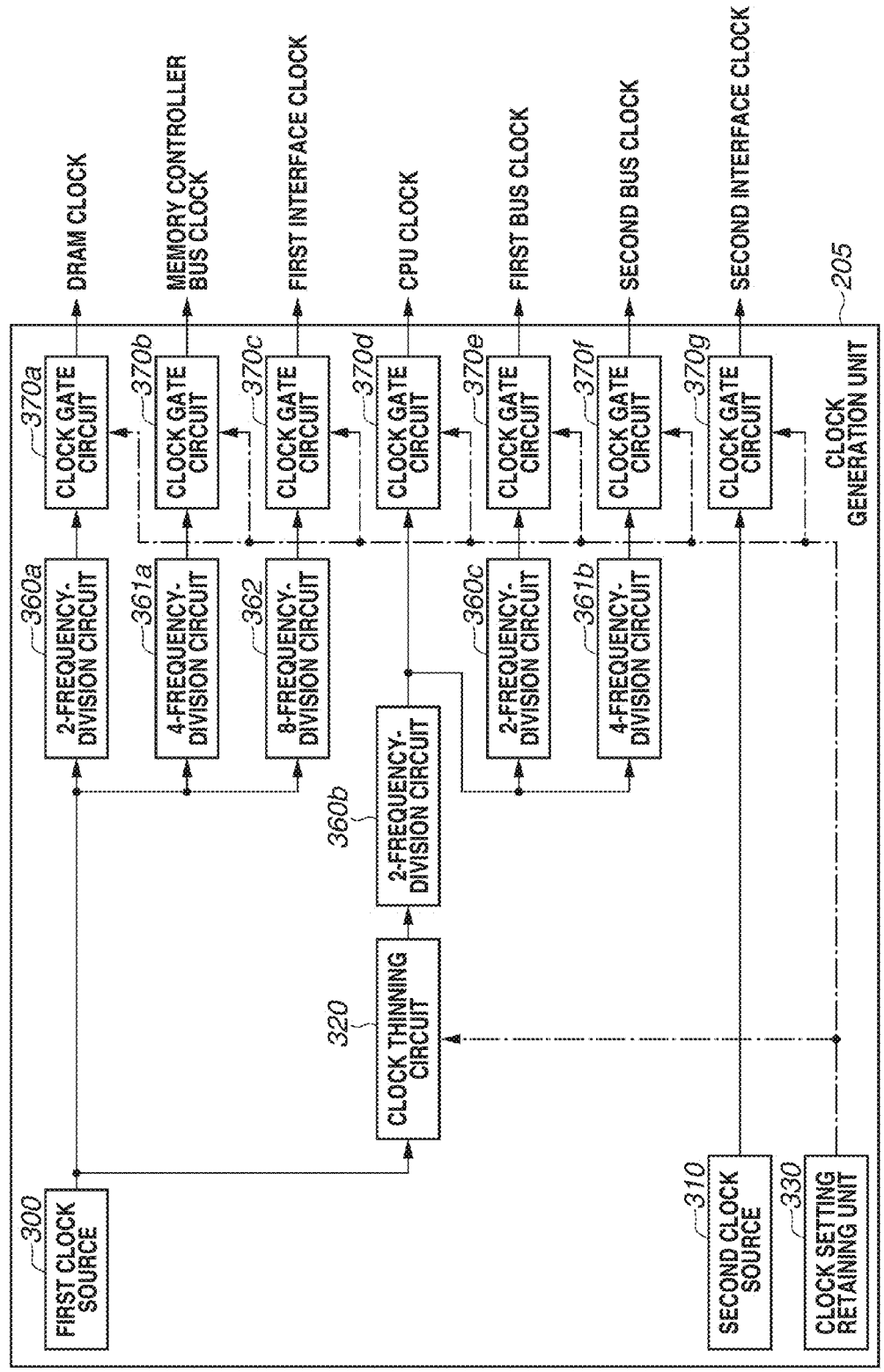

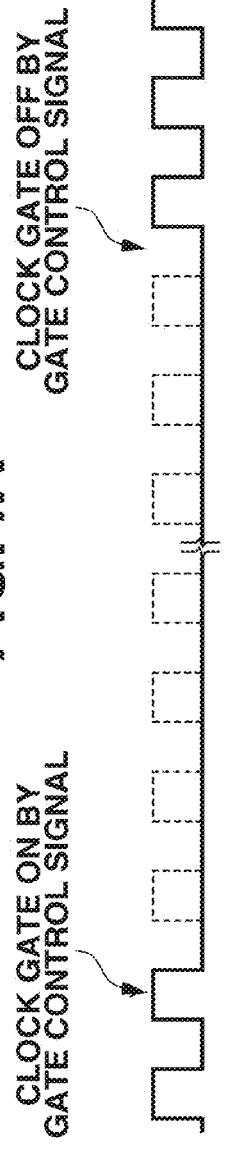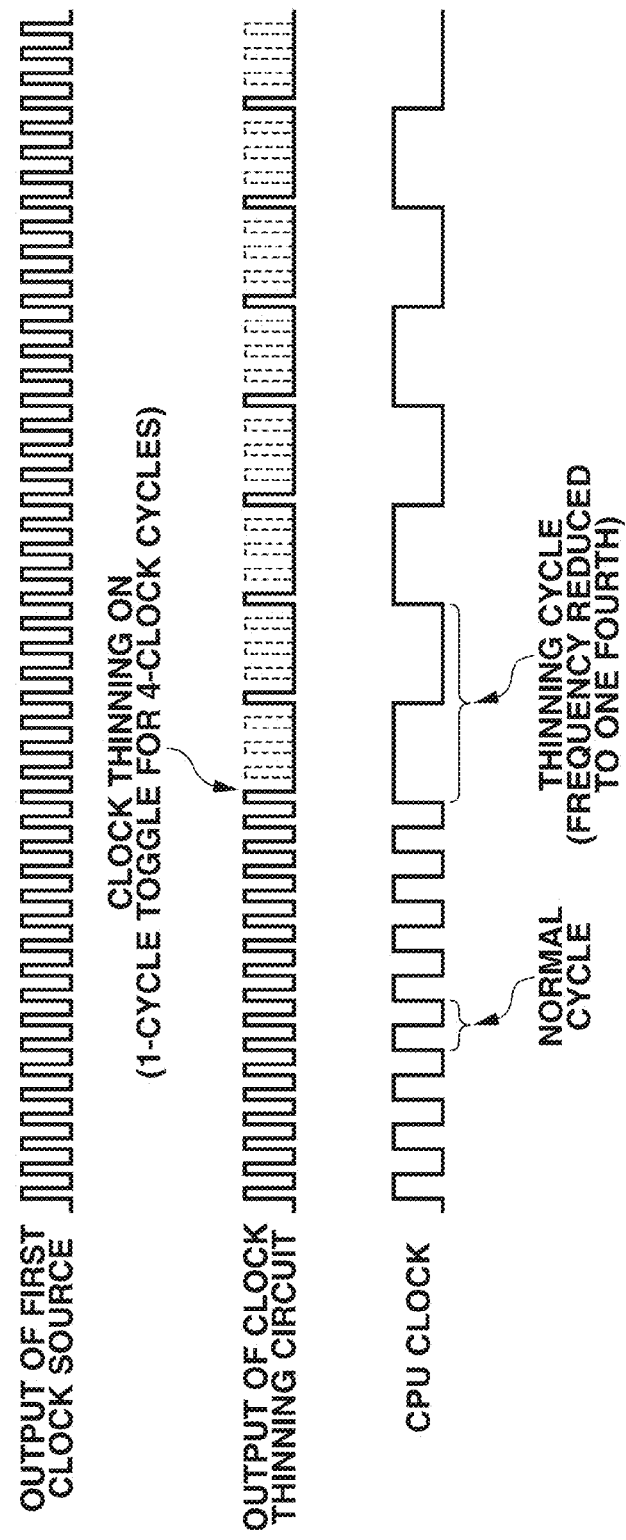
FIG.4A
FIG.4B

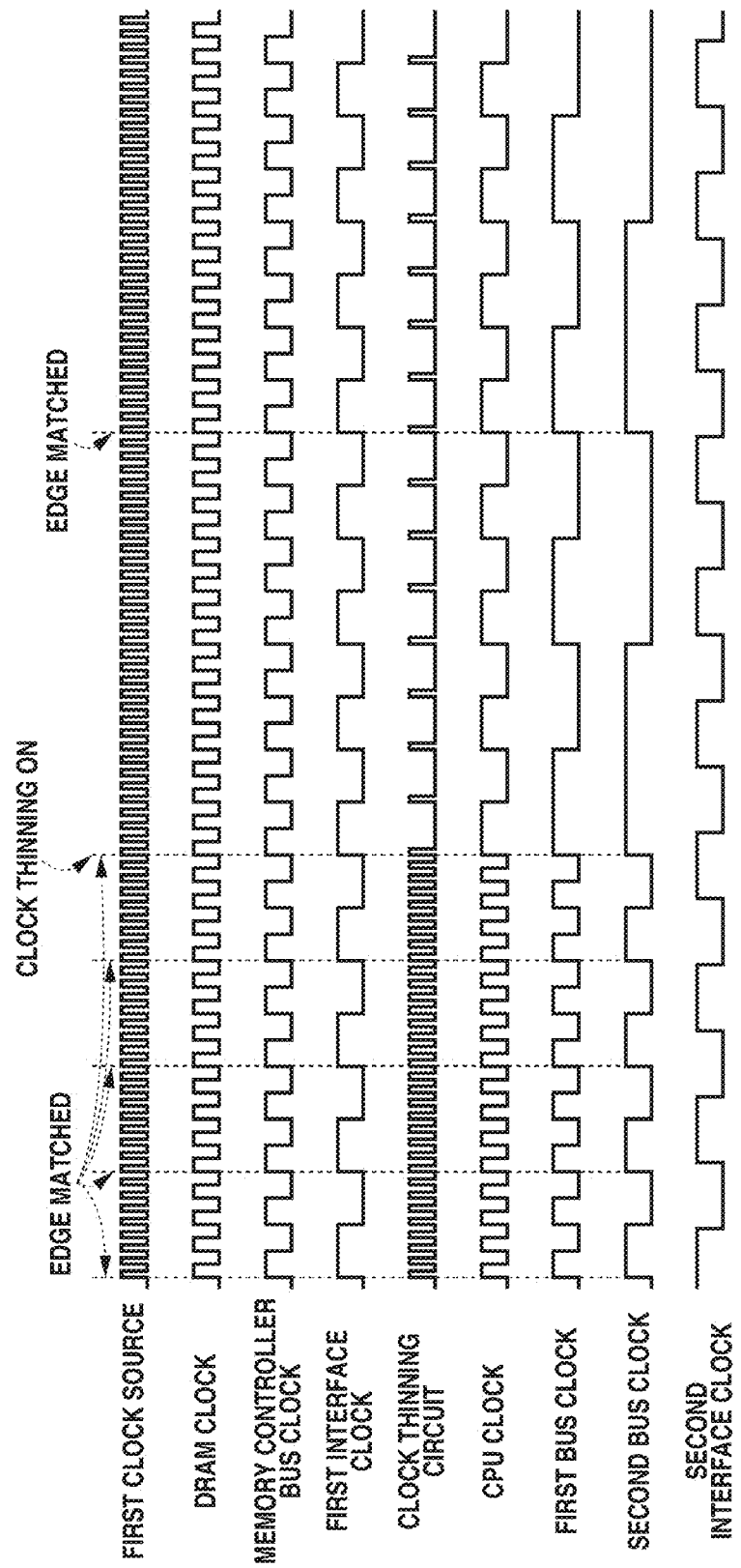

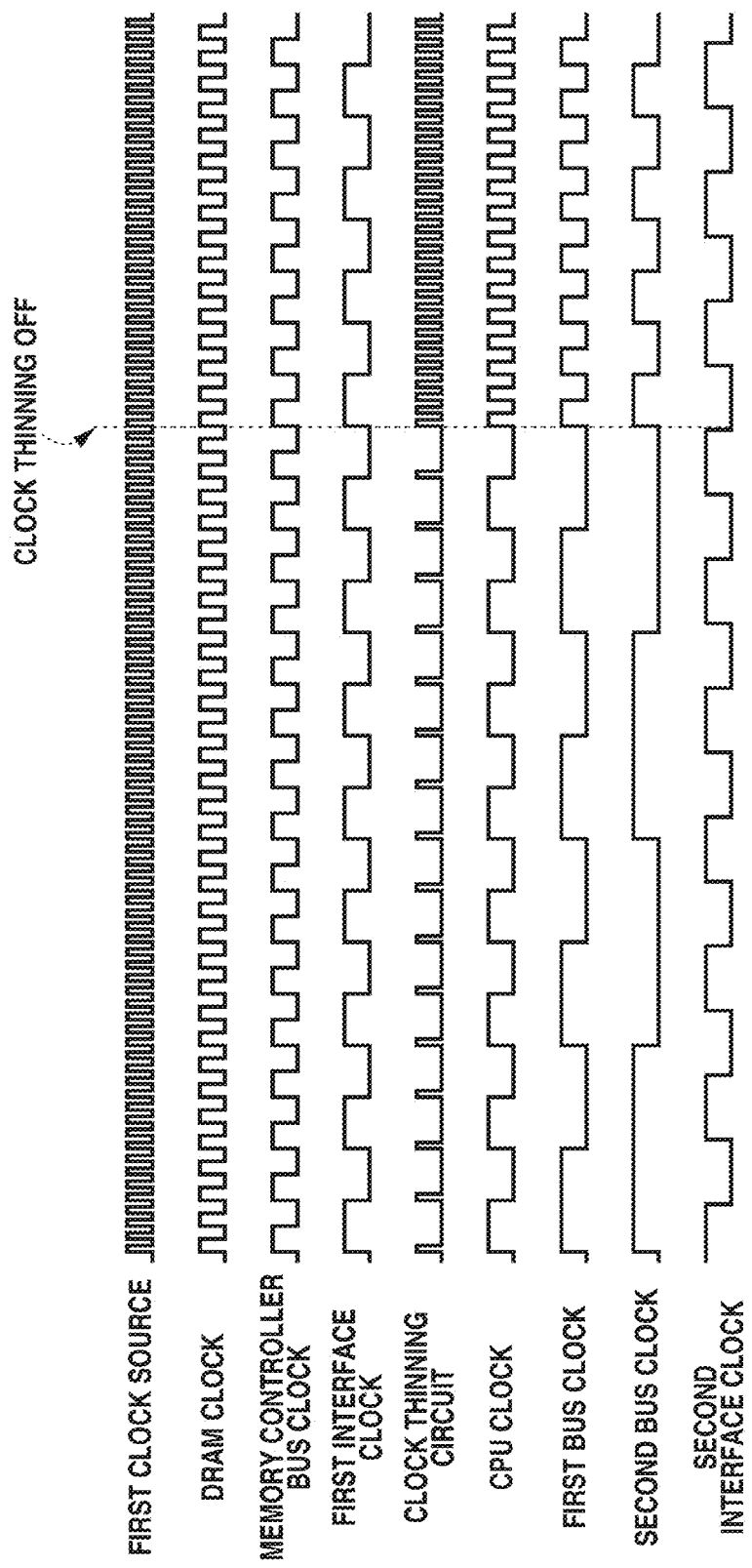

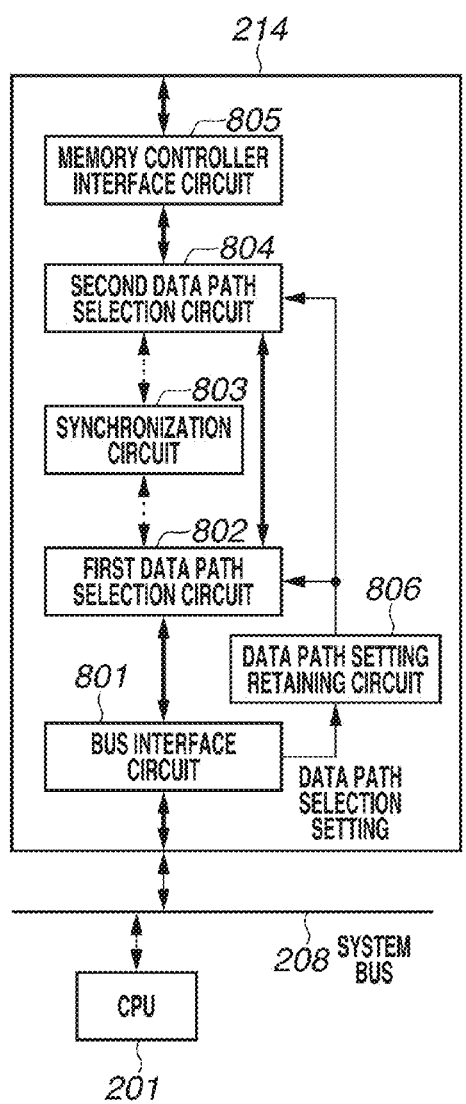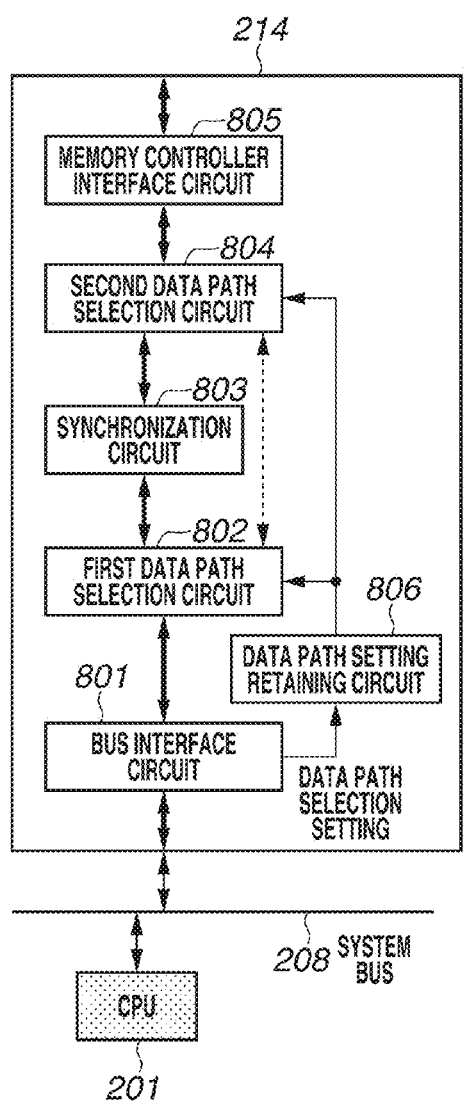

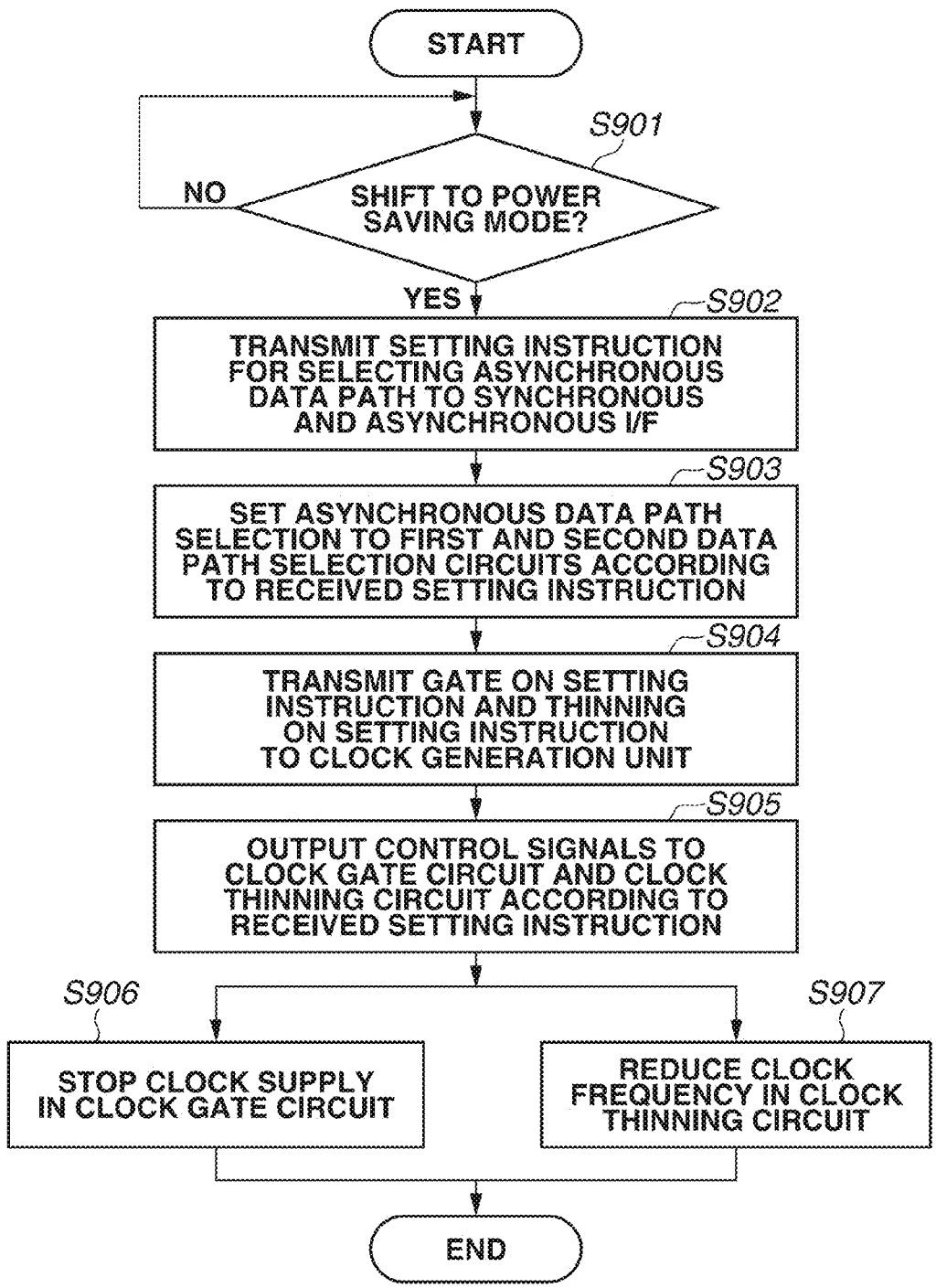

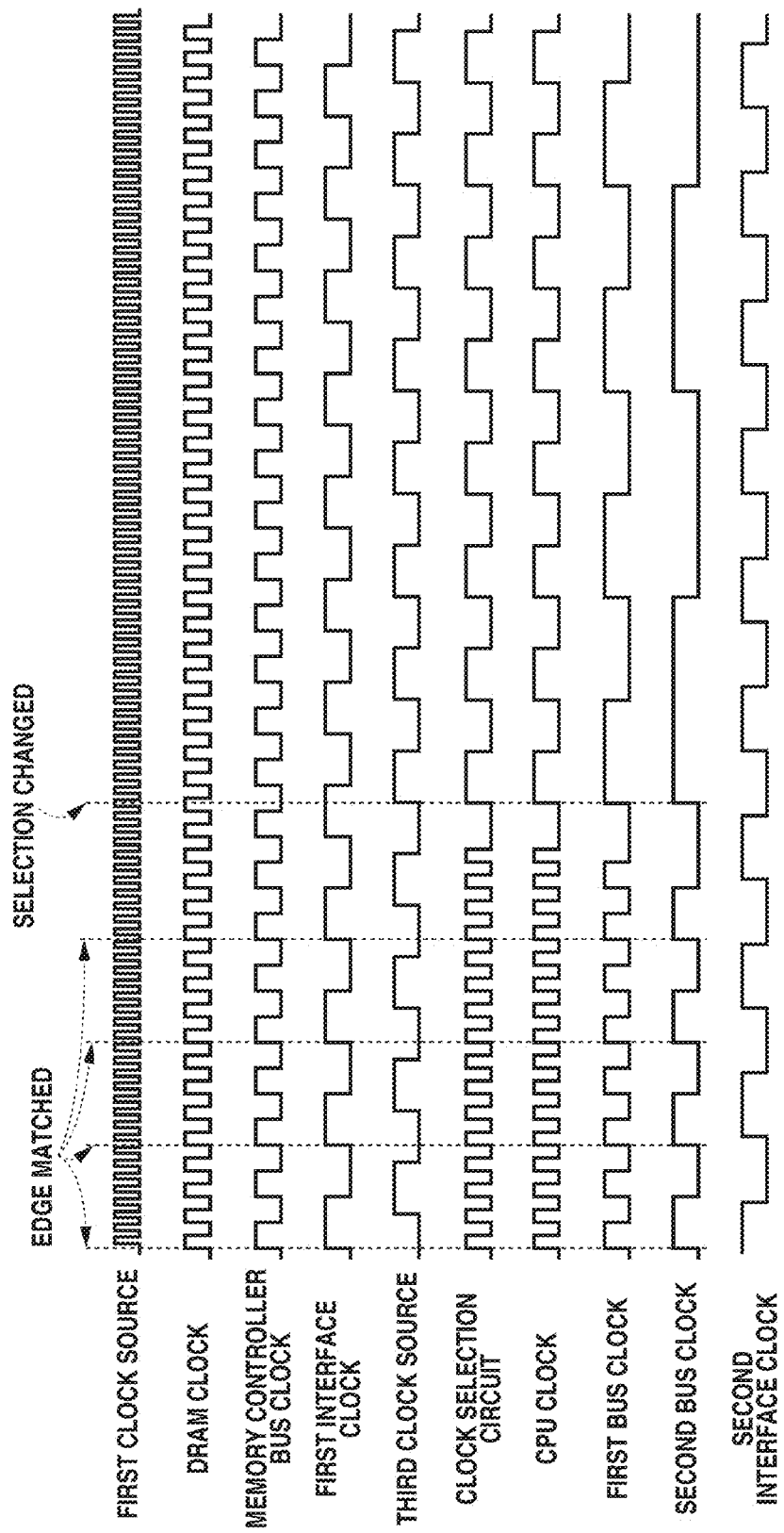

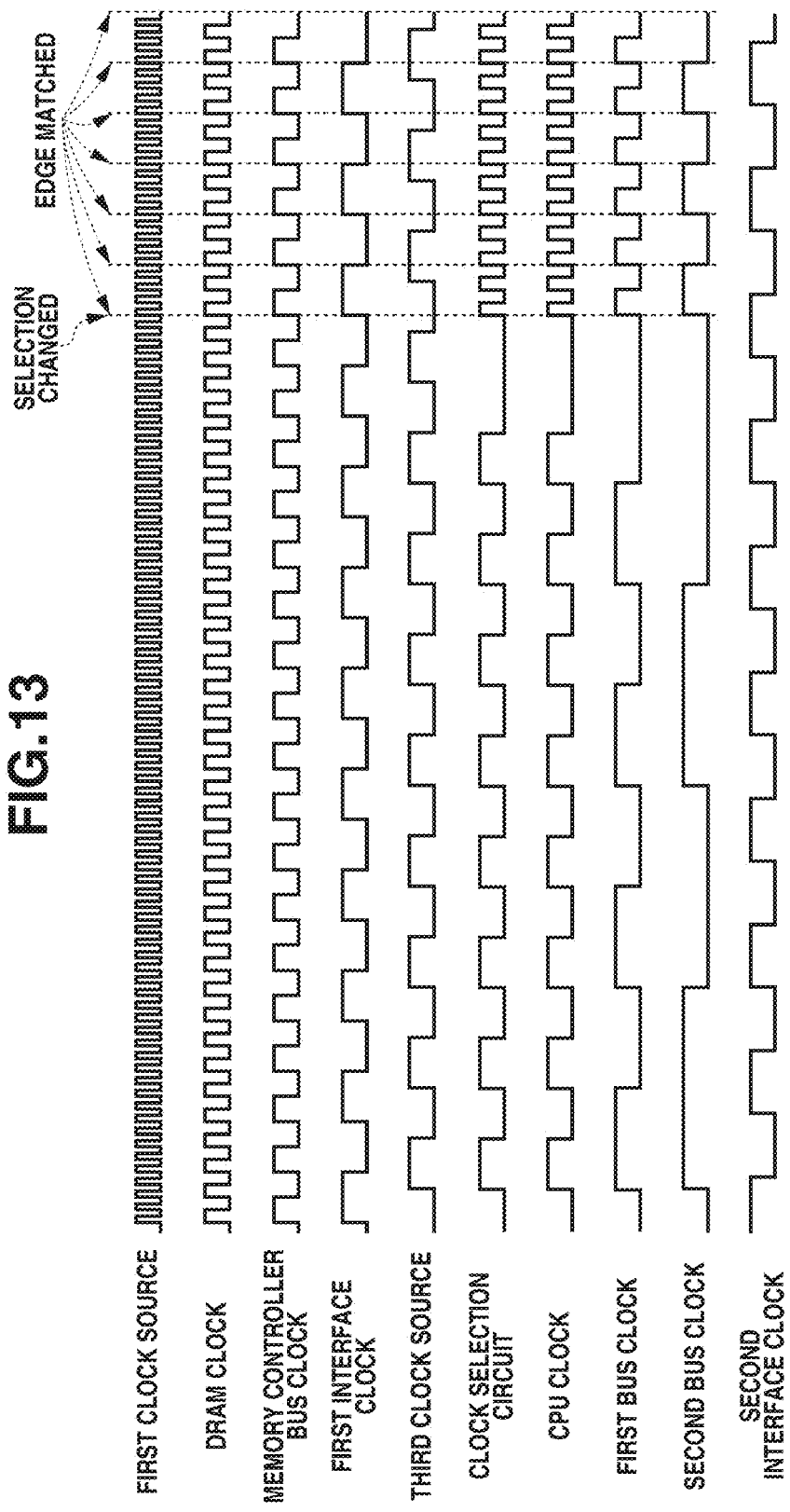

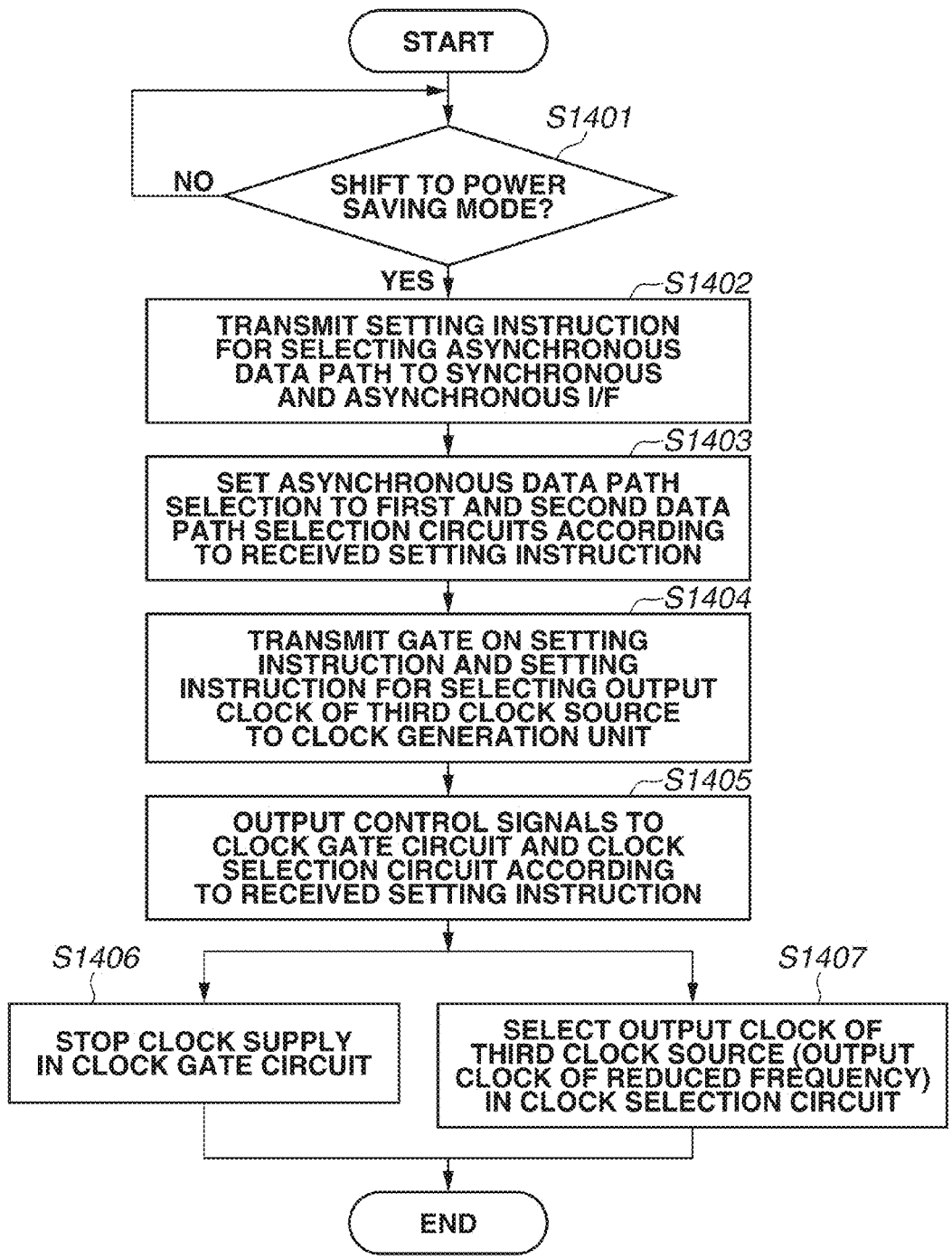

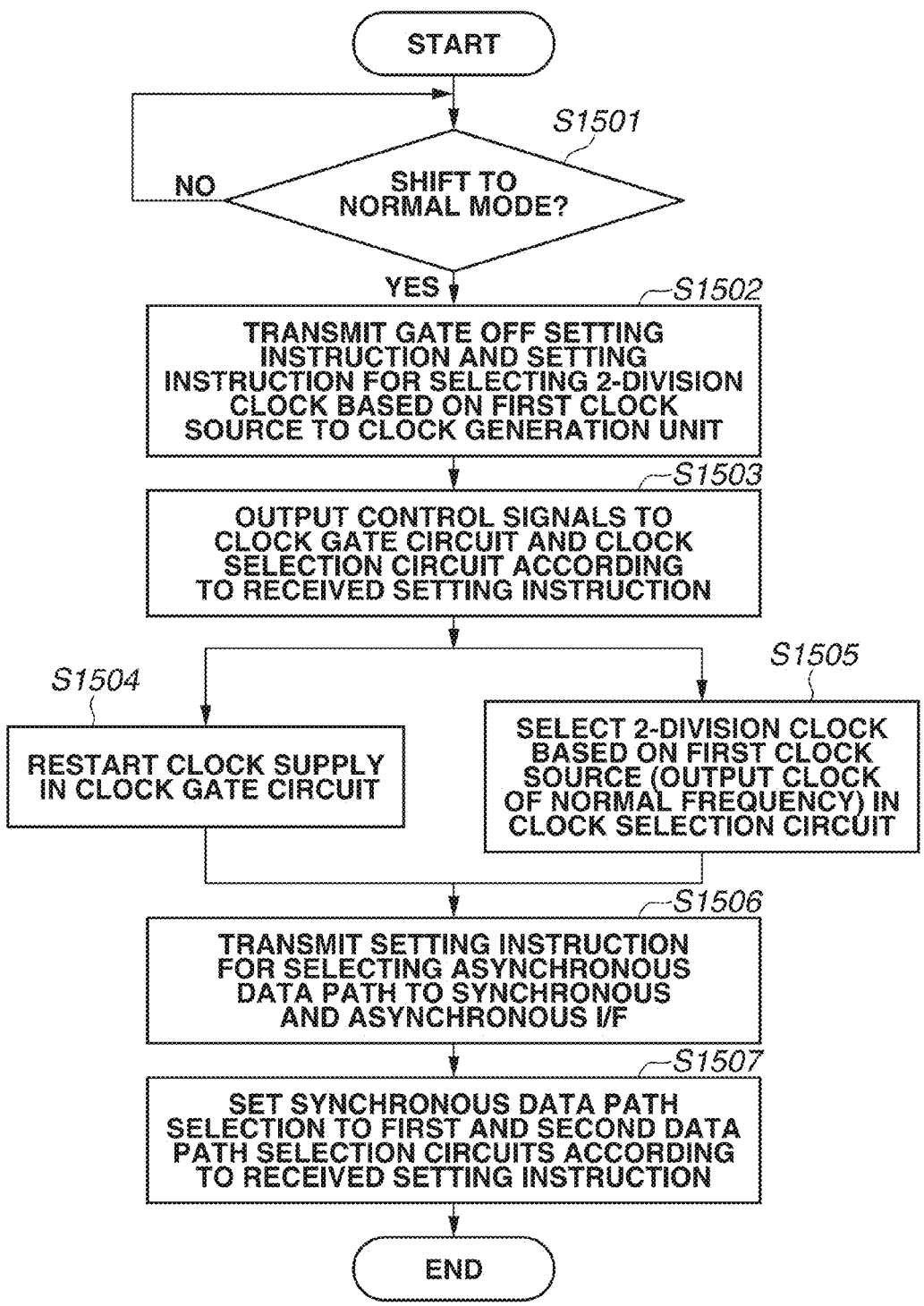

SEMICONDUCTOR INTEGRATED CIRCUIT, APPARATUS WITH SEMICONDUCTOR INTEGRATED CIRCUIT, AND CLOCK CONTROL METHOD IN SEMICONDUCTOR INTEGRATED CIRCUIT

BACKGROUND OF THE INVENTION

1. Field of the Invention

One disclosed aspect of the embodiments relates to a technique for adjusting phases between clocks in a semiconductor integrated circuit.

2. Description of the Related Art

Semiconductor integrated circuits are used in information processing apparatuses such as personal computers (PCs) and image forming apparatuses such as multi function printers (MFPs). Generally, a semiconductor integrated circuit used for these apparatuses incorporates a bus structure to perform data transfer to/from a central processing unit (CPU) and various peripheral functional circuits. In a bus in such a semiconductor integrated circuit, a flip-flop (FF) synchronization circuit operating on a clock-synchronous basis transmits and receives data. Data transfer by using a synchronous bus is achieved in this way. In synchronization circuit design, circuit design is performed on the premise of matched edge positions of clocks to achieve timing design in which the setup time and holding time of the FF are verified to ensure operations. Further, in a semiconductor integrated circuit using a plurality of clocks, if the relation between clocks for operating the FF is such that the ratio of respective clock frequencies is a natural number and edge positions are matched (hereinafter referred to as a synchronous relation), a normal operation as a synchronization circuit is ensured as long as timing design is satisfied with the clock cycle at higher speed. On the other hand, if the clocks for operating the FF are not in the above-described synchronous relation (in an asynchronous relation), the data transfer time is extremely short and accordingly the setup time and hold time of the FF cannot be satisfied. In this case, normal data transfer cannot be achieved. Therefore, in case of clocks in an asynchronous relation, normal data transfer is generally achieved by providing a synchronization circuit such as a double latch.

However, a configuration for performing data transfer using a synchronization circuit requires a larger number of clock cycles to perform data transfer than a configuration for performing data transfer without using a synchronization circuit. Therefore, the delay time until data transfer is completed increases to cause performance degradation of an apparatus using such a semiconductor integrated circuit.

A technique for preventing a delay time in data transfer by using a synchronization circuit is discussed, for example, in Japanese Patent Application Laid-Open No. 2012-99921. In data transfer between clocks in an asynchronous relation, the technique discussed in Japanese Patent Application Laid-Open No. 2012-99921 uses an enable signal indicating edge positions between clocks to achieve safe data transfer between clocks in an asynchronous relation without using a synchronization circuit.

In the technique discussed in Japanese Patent Application Laid-Open No. 2012-99921, since there needs to exist a timing at which edge positions of clocks are matched, data transfer between clocks in a completely asynchronous relation is to be necessarily abandoned. Further, in the case of a synchronization circuit using both a fixed-frequency clock and a variable-frequency clock, the synchronous relation between clocks is not uniquely determined. However, as described above, a configuration on the premise of the use of a synchronization circuit increases a delay time in data transfer, causing performance degradation of a semiconductor integrated circuit and an apparatus having the semiconductor integrated circuit.

SUMMARY OF THE INVENTION

According to an aspect of the embodiments, a semiconductor integrated circuit includes, a fixed frequency-division clock generation unit configured to generate a fixed frequency-division clock with a fixed frequency based on an output clock of a clock source, a variable frequency-division clock generation unit configured to generate a variable frequency-division clock with a variable frequency based on the output clock of the clock source, and a data path selection unit configured to select a data path as a data path for transferring data between a first functional module operating based on the fixed frequency-division clock and a second functional module operating based on the variable frequency-division clock. While the variable frequency-division clock is generated by the variable frequency-division clock generation unit, the data path selection unit selects a data path using a synchronization unit for converting the data into clock-synchronous data on a receiving side. While the variable frequency-division clock is not generated by the variable frequency-division clock generation unit, the data path selection unit selects a data path without using the synchronization unit.

Further features of the disclosure will become apparent from the following description of exemplary embodiments with reference to the attached drawings.

BRIEF DESCRIPTION OF THE DRAWINGS

FIG. 1 is a block diagram illustrating a system configuration of an image forming apparatus as an example of an apparatus having a semiconductor integrated circuit.

FIG. 2 is a block diagram illustrating an internal configuration of a main controller.

FIG. 3 is a block diagram illustrating an internal configuration of a clock generation unit according to a first exemplary embodiment.

FIG. 4A illustrates a state where clock oscillation is suspended by a clock gate circuit.

FIG. 4B illustrates a state where a clock is thinned out by a clock thinning circuit.

FIG. 5 illustrates a process of a state transition from a state where the clock thinning circuit outputs a normal clock to a state where it outputs a thinned-out clock.

FIG. 6 illustrates a process of a state transition from a state where the clock thinning circuit outputs a thinned-out clock to a state where it outputs a normal clock.

FIGS. 8A, 8B, and 8C illustrate an internal configuration and operations of a synchronous and asynchronous I/F.

FIG. 9 is a flowchart illustrating a control flow at the time of a state transition from a normal mode to the power saving mode according to the first exemplary embodiment.

FIG. 12 illustrates a process of a state transition from a state where a clock selection circuit selects an output clock of a 2-frequency-division circuit that frequency-divides a clock of a first clock source by 2 to a state where it selects an output clock of a third clock source.

FIG. 13 illustrates a process of a state transition from a state where the clock selection circuit selects the output clock of the third clock source to a state where it selects a 2-division clock that divides the clock of the first clock source by 2.

FIG. 14 is a flowchart illustrating a control flow at the time of a state transition from the normal mode to the power saving mode according to the second exemplary embodiment.

FIG. 15 is a flowchart illustrating a control flow at the time of a return from the power saving mode to the normal mode according to the second exemplary embodiment.

DESCRIPTION OF THE EMBODIMENTS

Figure 7:
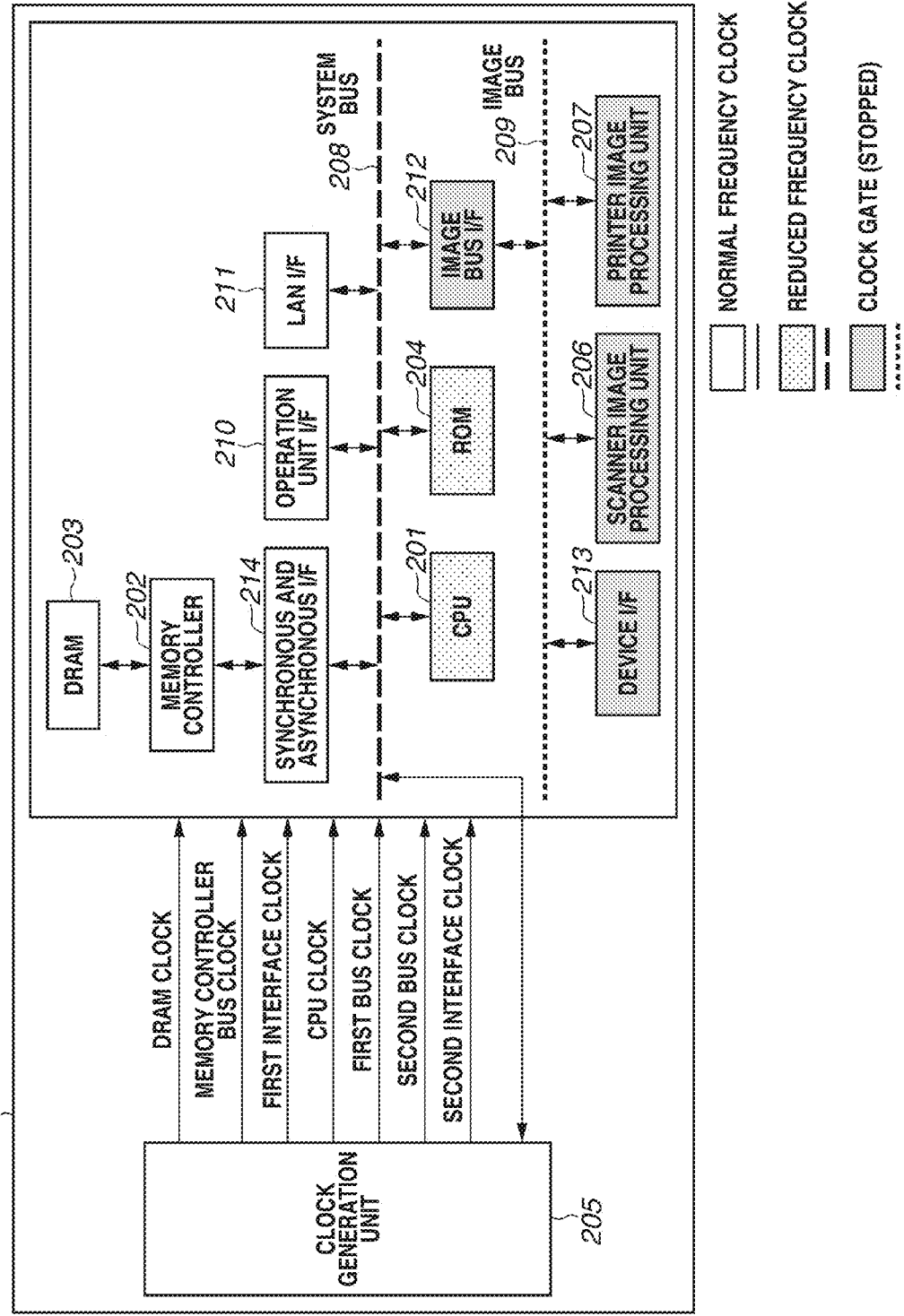
FIG. 7 illustrates a state of clock supply from the main controller to each functional module in a power saving mode.

Preferred exemplary embodiments will be described in detail below with reference to the accompanying drawings. Configurations illustrated in the following exemplary embodiments are to be considered as examples. The disclosure is not limited to the following configurations.

A first exemplary embodiment will be described below. FIG. 1 is a block diagram illustrating a system configuration of an image forming apparatus as an example of an apparatus having a semiconductor integrated circuit according to the present exemplary embodiment. An image forming apparatus 100 is a Multi Function Printer (MFP) for achieving a plurality of functions such as a copying machine, a printer, and FAX in one unit. The image forming apparatus 100 includes a main controller 101, an operation unit 102 serving as a user interface, a scanner 103 serving as an image input device, and a printer 104 serving as an image output device.

The operation unit 102, the scanner 103, and the printer 104 are connected to the main controller 101 and controlled by an instruction from the main controller 101. Further, the main controller 101 is connected with a local area network (LAN) 106, and is connected with a personal computer (PC) 105 via the LAN 106.

The PC 105, a general computer, transmits a print instruction (print job) for document data generated by an application operating on the PC 105, to the image forming apparatus 100 via the LAN 106.

<Configuration of Main Controller>

The main controller 101 of the image forming apparatus 100 will be described in detail below.

FIG. 2 is a block diagram illustrating an internal configuration of the main controller 101. The main controller 101 for controlling the entire image forming apparatus 100 controls the scanner 103 and the printer 104 while outputting and inputting image data, device information, etc. to/from the PC 105 via the LAN 106.

The main controller 101 includes a CPU 201, a memory controller 202, a dynamic random access memory (DRAM) 203, a read only memory (ROM) 204, a clock generation unit 205, a scanner image processing unit 206, a printer image processing unit 207, a system bus 208, and an image bus 209. The main controller 101 further includes various interfaces such as an operation unit interface (I/F) 210, a LAN I/F 211, an image bus I/F 212, a device I/F 213, and a synchronous and asynchronous I/F 214.

The CPU 201 is connected with the ROM 204, the image bus I/F 212, the memory controller 202, the operation unit I/F 210, the LAN I/F 211, the synchronous and asynchronous I/F 214, and the clock generation unit 205 via the system bus 208. The ROM 204 is a read only memory for storing a system boot program and predetermined executable programs. The DRAM 203 is a semiconductor memory with standardized data transfer rate and data transfer specifications such as Double Data Rate (DDR) 3. The DRAM 203 is a storage area readable and writable as needed, for providing a work area serving as a work memory for the CPU 201. The DRAM 203 is used to store temporary setting values of the image forming apparatus 100 and information about a job to be executed, and is also used as an image memory for temporarily storing image data. The memory controller 202 controls the DRAM 203, and writes and reads data to/from the DRAM 203.

The operation unit I/F 210 is an interface for outputting and inputting data to/from the operation unit 102. The operation unit I/F 210 is used to output image data to be displayed on the operation unit 102, and transmit information input by a user via the operation unit 102 to the CPU 201. The LAN I/F 211 is an interface for connecting with the LAN 106, and outputs and inputs information to/from the LAN 106. The image bus I/F 212 is an interface for connecting the system bus 208 and the image bus 209 for transferring image data at high speed, and operates as a bus bridge for converting the data structure. The device I/F 213, the scanner image processing unit 206, and the printer image processing unit 207 are connected to the image bus 209. The device I/F 213 is an interface for connecting the scanner 103 and the printer 104 with the main controller 101, and converts an image data format. The synchronous and asynchronous I/F 214 is an interface for performing data transfer between the system bus 208 and the memory controller 202. The synchronous and asynchronous I/F 214 will be described in detail below.

The clock generation unit 205 includes oscillator circuits such as a crystal oscillator and a phase locked loop (PLL), and frequency dividers for frequency-dividing output clocks of the relevant oscillator circuits to generate and output various clocks for operating synchronization circuits. The clock generation unit 205 supplies various clocks to functional modules in the main controllers 101, such as the CPU 201, the ROM 204, the memory controller 202, the DRAM 203, the buses 208 and 209, the image processing units 206 and 207, and various kinds of I/F. The configuration of the clock generation unit 205 and clocks to be output therefrom will be described in detail below. Each functional module in the main controller 101 is configured, for example, by a complementary metal oxide semiconductor (CMOS) integrated circuit.

The scanner image processing unit 206 performs various kinds of image processing such as correction, modification, and editing on input image data read from the scanner 103. The printer image processing unit 207 performs various kinds of image processing such as color conversion, filter processing, and resolution conversion on print image data to be output to the printer 104.

<Clock Generation Unit>

FIG. 3 is a block diagram illustrating an internal configuration of the clock generation unit 205 according to the present exemplary embodiment. The clock generation unit 205 includes a first clock source 300, a second clock source 310, a clock thinning circuit 320, and a clock setting retaining unit 330. The clock generation unit 205 further includes a plurality of frequency-division circuits and clock gate circuits (2-frequency-division circuits 360a to 360c, 4-frequency-division circuits 361a and 361b, an 8-frequency-division circuit 362, and clock gate circuits 370a to 370g).

The first clock source 300 and the second clock source 310 are oscillator circuits such as a crystal oscillator and a PLL, and generate and output clocks oscillating at different phases and frequencies.

Each of the 2-frequency-division circuits 360a to 360c, the 4-frequency-division circuits 361a and 361b, and the 8-frequency-division circuit 362 inputs the output clock of a clock source or a frequency-division circuit in the preceding stage and generates a new frequency-division clock. More specifically, each of the 2-frequency-division circuits 360a to 360c generates a frequency-division clock with a frequency that is a half of the input clock frequency. Each of the 4-frequency-division circuits 361a and 361b generates a frequency-division clock with a frequency that is one fourth of the input clock frequency. The 8-frequency-division circuit 362 generates a frequency-division clock with a frequency that is one eighth of the input clock frequency. Although in the present exemplary embodiment, 2-, 4-, and 8-frequency-division circuits are used as examples of frequency-division circuits, the number of frequency-divisions is not limited thereto. For example, 3- and 16-frequency-division circuits may be provided according to clock frequencies required by the functional modules in the main controller 101.

The clock gate circuits 370a to 370g control the presence or absence of a toggle based on a gate control signal from the clock setting retaining unit 330 (described below). More specifically, when the clock gate function is turned ON by using the gate control signal, the clock gate circuits 370a to 370g fix the clock to be output to the Low level to suspend clock supply (oscillation). FIG. 4A illustrates a state where the clock oscillation is suspended by the clock gate circuits 370a to 370g. Referring to FIG. 4A, the waveform portions shown by dotted lines indicate the normal toggled clock which would otherwise appear when the clock gate function is not turned ON (when the gate function is turned OFF). The clock generation unit 205 supplies a DRAM clock, a memory controller bus clock, a first interface clock, a CPU clock, a first bus clock, a second bus clock, and a second interface clock to the synchronization circuits of the functional modules in the main controller 101 via the clock gate circuits 370a to 370g. The correspondence relation between each clock and functional modules is as follows.

DRAM clock: DRAM 203
Memory controller bus clock: Memory controller 202 and synchronous and asynchronous I/F 214
First interface clock: LAN I/F 211
CPU clock: CPU 201
First bus clock: ROM 204, system bus 208, and synchronous and asynchronous I/F 214
Second bus clock: Scanner image processing unit 206, printer image processing unit 207, image bus 209, image bus I/F 212, and device I/F 213
Second interface clock: Operation unit I/F 210

These clocks can be applied with gate control by the respective clock gate circuits 370a to 370g. Accordingly, the power consumption of the image forming apparatus 100 can be reduced by individually suspending clock supply to the synchronization circuit of each functional module which needs not operate.

Based on a thinning control signal from the clock setting retaining unit 330 (described below), the clock thinning circuit 320 outputs a clock (thinned-out clock) in which toggles are thinned out from the output clock of the first clock source 300 via an internal clock gate circuit. FIG. 4B illustrates a state where the clock output from the first clock source 300 is thinned out by the clock thinning circuit 320. Referring to FIG. 4B, when clock thinning is turned ON by the thinning control signal, the output clock is periodically toggled so as to repeat a cycle in which 3 cycles among continuous 4 clock cycles are thinned out. In this case, since the CPU clock is generated by frequency-dividing the output clock of the clock thinning circuit 320 by 2 by the 2-frequency-division circuit 360b, the frequency of the CPU clock is reduced to one fourth of the normal frequency (the period is quadrupled). Although, in the present exemplary embodiment, the output clock is periodically toggled so as to repeat a cycle in which 3 cycles among continuous 4 clock cycles are thinned out as an example of a clock thinning circuit, the clock thinning method is not limited thereto. For example, 6 cycles among clock cycles may be thinned out according to clock frequencies required to reduce the power consumption of the image forming apparatus 100. Supplying a clock with a thus-reduced frequency to the synchronization circuit of each functional module of which operation speed can be reduced enables reducing the power consumption of the image forming apparatus 100 while operating the relevant synchronization circuit.

The clock setting retaining unit 330 is a circuit for holding the contents of setting instructions for controlling the clock thinning circuit 320 and the clock gate circuits 370a to 370g, and outputting respective clock control signals (the thinning control signal and the gate control signals). Clock control settings retained by the clock setting retaining unit 330 are set by the CPU 201 via the system bus 208.

<State Transition from Normal Clock Output State to Thinned-Out Clock Output State>

FIG. 5 illustrates a process of a state transition from a state where the clock thinning circuit 320 outputs a normal clock to a state where it outputs a thinned-out clock. In the present exemplary embodiment, the DRAM clock, the memory controller bus clock, the first interface clock, the CPU clock, the first bus clock, and the second bus clock are generated based on the first clock source 300 serving as a common clock source. Therefore, these clocks can be in a mutually synchronized relation (hereinafter referred to as a synchronous relation) in which the rising edges are matched at a timing "Edge Matched" indicated by dotted lines in FIG. 5. Therefore, for synchronization circuits operating by these clocks, a normal data transfer operation can be ensured by performing timing design between clocks at which data transfer occurs. On the other hand, the second interface clock generated based on the second clock source 310 serving as a clock source independent of the first clock source 300, and the above-described clocks are not in a synchronous relation (hereinafter referred to as an asynchronous relation). Therefore, a data synchronization circuit is required for data transfer to/from a synchronization circuit operating by the second interface clock.

Referring to the example illustrated in FIGS. 4A and 4B, since 3 cycles among continuous 4 clock cycles are thinned out, the clock generated based on the first clock source 300 and the clock generated from the first clock source 300 via the clock thinning circuit 320 are in a synchronous relation. However, when the clock thinning circuit 320 thins out 2 cycles among continuous 3 clock cycles, for example, the clock generated based on the first clock source 300 and the clock generated from the first clock source 300 via the clock thinning circuit 320 may be in an asynchronous relation. In this case, a data synchronization circuit is required for data transfer to/from a circuit supplied with the clock generated via the clock thinning circuit 320.

Among the output clocks of the clock generation unit 205, the DRAM clock, the memory controller bus clock, and the first interface clock are not related with the clock output from the clock thinning circuit 320, and have a fixed frequency. These clocks are used in a case where dynamic frequency variation is not allowed and a case where the frequency must be a predetermined frequency. The CPU clock, the first bus clock, and the second bus clock are frequency-division clocks generated by frequency-dividing the output clock of the clock thinning circuit 320, and have a variable frequency according to a clock thinning setting. When the clock thinning setting is turned ON at a timing "Clock Thinning ON" illustrated in FIG. 5, the frequency of the output clock of the clock thinning circuit 320 decreases. Thus, when the clock thinning circuit 320 changes from a normal frequency output state to a reduced frequency output state, not only the frequency ratio of the clock but also the phase of the clock changes depending on the ratio of thinning. In the example illustrated in FIG. 5, the relation between the memory controller bus clock and the first bus clock changes from a frequency ratio of 1:1 to a frequency ratio of 4:1, there exists a timing at which the rising edges are matched once every 4 cycles.

<State Transition from Thinned-Out Clock Output State to Normal Clock Output State>

FIG. 6 illustrates a process of a state transition from a state where the clock thinning circuit 320 outputs a thinned-out clock to a state where it outputs a normal clock. When the clock thinning setting is turned OFF at a timing "Clock Thinning OFF" illustrated in FIG. 6, the frequency of the output clock of the clock thinning circuit 320 returns to the normal frequency. When the frequency of the output clock of the clock thinning circuit 320 returns from the reduced frequency to the normal frequency in this way, the above-described frequency ratio of the clock also returns to the previous value. For example, the relation between the above-described memory controller bus clock and the first bus clock returns from a frequency ratio of 4:1 to a frequency ratio of 1:1, and the rising edges are matched in every cycle.

<Power Saving Control in Image Forming Apparatus>

Power saving control by the main controller 101 of the image forming apparatus 100 will be described below. The image processing apparatus 100 is provided with two different operation modes (normal mode and power saving mode) providing different power consumptions, according to the operation state. If the operation unit 102 does not receive any operation from the user or if a print job is not executed in a predetermined time period, the image forming apparatus 100 shifts from the normal mode (normal operating state) to the power saving mode (standby state) in which the power consumption is reduced. Therefore, in the power saving mode, since a print job is not executed, some functional modules on the main controller 101 enter a state where it is allowed not to operate or allowed to operate at reduced operating speed without trouble. More specifically, in the power saving mode, the clock generation unit 205 is allowed to suspend clock supply to some functional modules on the main controller 101 or reduce the frequencies of the relevant clocks.

FIG. 7 illustrates states of clock supply to respective functional modules of the main controller 101 in the power saving mode. Referring to FIG. 7, modules operating based on the normal clock output from the clock generation unit 205 (i.e., a clock without frequency reduction) include the DRAM 203, the memory controller 202, the operation unit I/F 210, the LAN I/F 211, and the synchronous and asynchronous I/F 214. Further, modules operating based on the thinned-out clocks output from the clock generation unit 205 (i.e., clocks with reduced frequencies) include the CPU 201, the ROM 204, and the system bus 208. Further, modules that stops operation when clock supply from the clock generation unit 205 is suspended under gate control by the clock gate circuits 370a to 370g include the image bus I/F 212, the device I/F 213, the scanner image processing unit 206, the printer image processing unit 207, and the image bus 209.

In the power saving mode, reducing the clock frequency or suspending clock supply in this way enables providing lower power consumption than in the normal mode. Then, when the user performs a return instruction operation via the operation unit 102 or a print job is received from the PC 105 via the LAN 106, suspended clock supply is restarted or the reduced frequencies are returned to the normal frequencies. Thus, the image forming apparatus 100 returns from the power saving mode to the normal mode and enters a state where print job processing becomes executable.

<Synchronous and Asynchronous I/F>

The synchronous and asynchronous I/F 214 will be described below. FIG. 8 illustrates an internal configuration and operations of the synchronous and asynchronous I/F 214.

Figure 8A:
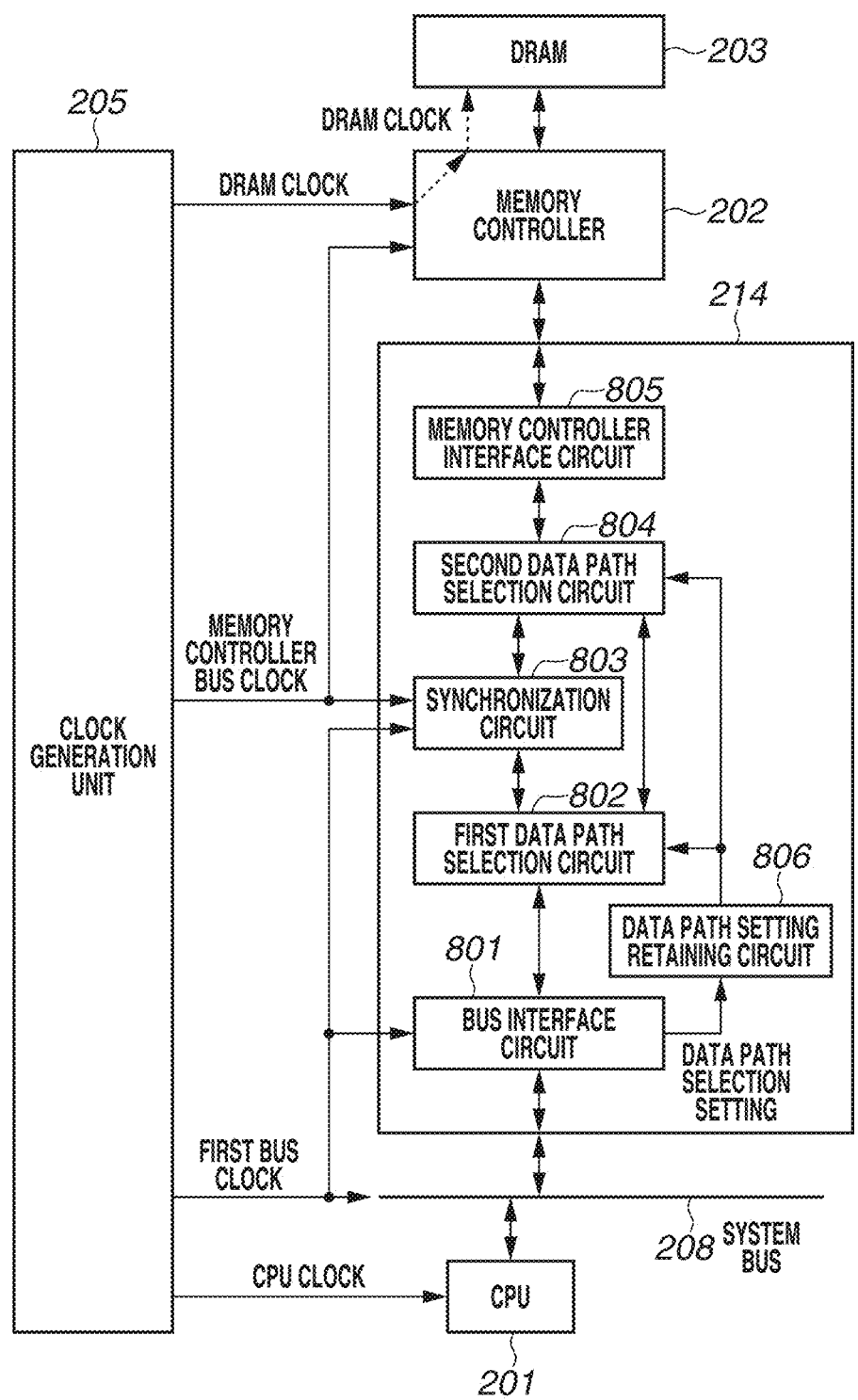

FIG. 8A illustrates destinations of the DRAM clock, the memory controller bus clock, the first bus clock, and the CPU clock among the clocks output by the clock generation unit 205. The DRAM clock is supplied to the DRAM 203 via the memory controller 202. The memory controller bus clock is supplied to the memory controller 202 and the synchronous and asynchronous I/F 214. The first bus clock is supplied to the system bus 208 and the synchronous and asynchronous I/F 214. The CPU clock is supplied to the CPU 201.

In the memory controller 202, data is exchanged in a synchronous relation in which the DRAM clock and the memory controller bus clock have a fixed frequency ratio of 2:1. Further, with regard to the DRAM clock used for data transfer to/from the DRAM 203 via the memory controller 202, it is not desirable that the frequency dynamically changes during operation of the DRAM 203. Therefore, the frequency is fixed for the DRAM clock and the memory controller bus clock in a synchronous relation with the DRAM clock.

The frequency is reduced for the CPU clock and the first bus clock through thinning control in the clock thinning circuit 320, as illustrated in FIG. 5. For the CPU clock and the first bus clock, the frequency is reduced while maintaining the frequency ratio (i.e., a synchronous relation), data transfer on the CPU 201 and the system bus 208 can be performed without problem.

The internal configuration of the synchronous and asynchronous I/F 214 will be described below. The synchronous and synchronous I/F 214 includes a bus interface circuit 801, a first data path selection circuit 802, a synchronization circuit 803, a second data path selection circuit 804, a memory controller interface circuit 805, and a data path setting retaining circuit 806.

The bus interface circuit 801 performs synchronous data transfer based on the bus protocol on the side of the system bus 208.

The memory controller interface circuit 805 performs synchronous data transfer based on the interface specifications on the side of the memory controller 202.

The first data path selection circuit 802 is a selector circuit for selecting a data path to be used (i.e., for selecting which of the synchronization circuit 803 and the second data path selection circuit 804 to exchange data with) based on a data path selection control signal.

The second data path selection circuit 804 is a selector circuit for selecting a data path to be used (i.e., for selecting which of the first data path selection circuit 802 and the synchronization circuit 803 to exchange data with) based on a data path selection control signal.

The data path setting retaining circuit 806 retains a setting instruction for selecting a data path transmitted from the CPU 201, and outputs the retained data path selection setting to the first data path selection circuit 802 and the second data path selection circuit 804 as a data path selection control signal.

The synchronization circuit 803 converts clock-synchronous data to be supplied to the bus interface circuit 801 and clock-synchronous data to be supplied to the memory controller interface circuit 805 into each piece of clock-synchronous data on the reception side. The synchronization circuit 803 includes, for example, a first in first out (FIFO) buffer, outputs data input from the bus interface circuit 801 to the memory controller interface circuit 805, and outputs data input from the memory controller interface circuit 805 to the bus interface circuit 801.

The memory controller bus clock supplied to synchronous and asynchronous I/F 214 is supplied to the memory controller interface circuit 805 and the synchronization circuit 803. The first bus clock supplied to the synchronous and asynchronous I/F 214 is supplied to the bus interface circuit 801 and the synchronization circuit 803.

The frequency of the memory controller bus clock is fixed while the frequency of the first bus clock is variable. Therefore, in the power saving mode, the memory controller bus clock and the first bus clock are sometimes not in a synchronous relation. FIG. 8B illustrates that the frequency of the first bus clock is the normal frequency, and the use of data paths in the synchronous and asynchronous I/F 214 when the memory controller bus clock and the first bus clock are in a synchronous relation. Referring to FIG. 8B, the first data path selection circuit 802 and the second data path selection circuit 804 select the synchronous data path for directly performing data transfer between the bus interface circuit 801 and the memory controller interface circuit 805 according to a data selection control signal. In this case, the memory controller bus clock supplied to the memory controller interface circuit 805 and the first bus clock supplied to the bus interface circuit 801 have the same phase and the same frequency. Therefore, it becomes possible to perform high-speed clock-synchronous data transfer without delay between the system bus 208 and the memory controller 202.

On the other hand, FIG. 8C illustrates that the frequency of the first bus clock is a reduced frequency lower than the normal frequency, and the use of data paths in the synchronous and asynchronous I/F 214 when the memory controller bus clock and the first bus clock are not in a synchronous relation. Referring to FIG. 8C, the first data path selection circuit 802 and the second data path selection circuit 804 selects the asynchronous data path for performing data transfer between the bus interface circuit 801 and the memory controller interface circuit 805 via the synchronization circuit 803 according to a data selection control signal. In this case, the memory controller bus clock supplied to the memory controller interface circuit 805 and the first bus clock supplied to the bus interface circuit 801 may possibly differ not only in frequency but also in phase.

Therefore, although data transfer via the synchronization circuit 803 causes a delay in data transfer required for switching from the clock of the interface circuit on the input side to the clock of the interface circuit on the output side, it becomes possible to perform safe data transfer, without the occurrence of data loss, between the system bus 208 and the memory controller 202. As illustrated in FIGS. 4A and 4B, according to the present exemplary embodiment in which a variable frequency-division clock is generated from a thinned-out clock in which 3 cycles among 4 clock cycles of the same clock source are thinned out, there exists a timing at which the rising edges are matched even in the case of reduced frequencies. In this case, theoretically, data transfer does not need to be performed via a synchronization circuit. However, in the power saving mode, high-speed data transfer is not required and therefore selecting a data path using a synchronization circuit causes no problem.

<Data Path Control and Clock Control>

Data path control and clock control by the main controller 101 according to the present exemplary embodiment will be described below with reference to flowcharts.

Control processing at the time of a state transition from the normal mode to the power saving mode will be described below with reference to FIG. 9.

In step 901, the CPU 201 in the main controller 101 determines whether a cause of a state transition from the normal mode to the power saving mode has occurred. The relevant causes include, for example, a predetermined time period (for example, 15 minutes) having elapsed during which no print job is executed. When the CPU 201 determines that such a predetermined cause has occurred (YES in step S901), the processing proceeds to step 902. On the other hand, when the CPU 201 determines that such a predetermined cause has not occurred (NO in step S901), the CPU 201 continues monitoring.

In step 902, the CPU 201 transmits a data path setting instruction for selecting the asynchronous data path to the synchronous and asynchronous I/F 214 via the system bus 208.

In step 903, the synchronous and asynchronous I/F 214 retains the contents of the received setting instruction for selecting the asynchronous data path, and at the same time makes setting for selecting the asynchronous data path on the first data path selection circuit 802 and the second data path selection circuit 804. Thus, a data path using the synchronization circuit 803 is selected as a data path between the bus interface circuit 801 and the memory interface circuit 805. Upon completion of data path setting, the synchronous and asynchronous I/F 214 notifies the CPU 201 of completion of data path setting, for example, by using an interrupt signal.

In step 904, the CPU 201 transmits a setting instruction for turning ON the gate of a specific clock, and a setting instruction for thinning the clock to the clock generation unit 205 via the system bus 208.

In step 905, the clock setting retaining unit 330 in the clock generation unit 205 retains the contents of the two different received setting instructions and, at the same time, outputs predetermined control signals. More specifically, the clock setting retaining unit 330 outputs a gate control signal for tuning ON the gate to the corresponding clock gate circuit and outputs a thinning control signal for tuning ON thinning to the clock thinning circuit 320. In this case, the control signals for achieving the above-described state illustrated in FIG. 7 will be described in detail below.

TABLE 1

| Details of clock | Control signal |
| --- | --- |
| Supply thinned-out clock to CPU | Thinning ON, Gate OFF to clock gate circuit 370d |
| Supply thinned-out clock to ROM, system bus, and synchronous and asynchronous I/F 214 | Thinning ON, Gate OFF to clock gate circuit 370e |
| Stop clock supply to image bus, scanner image processing unit, printer image processing unit, image bus I/F, and device I/F | Thinning OFF, Gate ON to clock gate circuit 370f |

In step 906, the specific clock gate circuit (the clock gate circuit 370f in the above-described example) in the clock generation unit 205 turns ON the gate based on the gate control signal from the clock setting retaining unit 330. Thus, clock supply to predetermined functional modules which are allowed to stop operation is suspended.

In step 907, the clock thinning circuit 320 in the clock generation unit 205 turns ON thinning based on the thinning control signal from the clock setting retaining unit 330. Thus, clocks with reduced frequencies are supplied to predetermined functional modules that are allowed to operate at lower operating speed. This completes the processing for a state transition to the power saving mode.

This completes the description of the control processing performed at the time of a state transition from the normal mode to the power saving mode. As clearly understood from FIG. 9, steps 906 and 907 are processed in parallel. This control processing enables safe data transfer, without the occurrence of data loss, between the system bus 208 and the memory controller 202 while reducing the power consumption of the image forming apparatus 100.

Control processing at the time of a return from the power saving mode to the normal mode will be described below with reference to FIG. 10.

In step S1001, the CPU 201 in the main controller 101 determines whether a cause of a state transition from the power saving mode to the normal mode has occurred. The relevant causes include, for example, the reception of a print job from the PC 105 via the LAN 106. When the CPU 201 determines that such a predetermined cause of the state transition has occurred (YES in step S1001), the processing proceeds to step S1002. On the other hand, when the CPU 201 determines that such a predetermined cause of the state transition has not occurred (NO in step S1001), the CPU 201 continues monitoring.

In step S1002, the CPU 201 transmits a setting instruction for restarting suspended specific clock supply, and a setting instruction for returning a reduced specific clock frequency to the normal frequency, to the clock generation unit 205 via the system bus 208.

In step S1003, the clock setting retaining unit 330 in the clock generation unit 205 retains the contents of the two different received setting instructions and, at the same time, outputs predetermined control signals. More specifically, the clock setting retaining unit 330 outputs a gate control signal for turning OFF the gate to the corresponding clock gate circuit (the clock gate circuit 370f in the above-described example). The clock setting retaining unit 330 further outputs a thinning control signal for turning thinning OFF to the clock thinning circuit 320.

In step S1004, a specific clock gate circuit (the clock gate circuit 370f in the above-described example) in the clock generation unit 205 turns OFF the gate based on the gate control signal from the clock setting retaining unit 330. This control processing restarts clock supply.

In step S1005, the clock thinning circuit 320 in the clock generation unit 205 turns OFF thinning based on the thinning control signal from the clock setting retaining unit 330. Thereby, the output of the clock of the normal frequency is restarted.

In step S1006, the CPU 201 transmits a data path setting instruction for selecting the synchronous data path to the synchronous and asynchronous I/F 214 via the system bus 208.

In step S1007, the synchronous and asynchronous I/F 214 retains the contents of the received setting instruction for selecting the synchronous data path, and at the same time makes setting for selecting the above-described synchronous data path on the first data path selection circuit 802 and the second data path selection circuit 804. Thus, a data path for performing data transfer without using the synchronization circuit 803 (for directly performing data transfer between the bus interface circuits 801 and the memory controller interface circuit 805) is set as the data path between the bus interface circuit 801 and the memory controller interface circuit 805. Upon completion of data path setting, the synchronous and asynchronous I/F 214 notifies the CPU 201 of completion of data path setting, for example, by using an interrupt signal. This completes the processing for returning to the normal mode.

This completes the description of the control processing performed at the time of a state transition from the power saving mode to the normal mode. As clearly understood from FIG. 10, the steps 1004 and 1005 are processed in parallel. This control processing enables performing clock-synchronous data transfer without delay between the system bus 208 and the memory controller 202, after returning to the normal mode.

Figure 10:
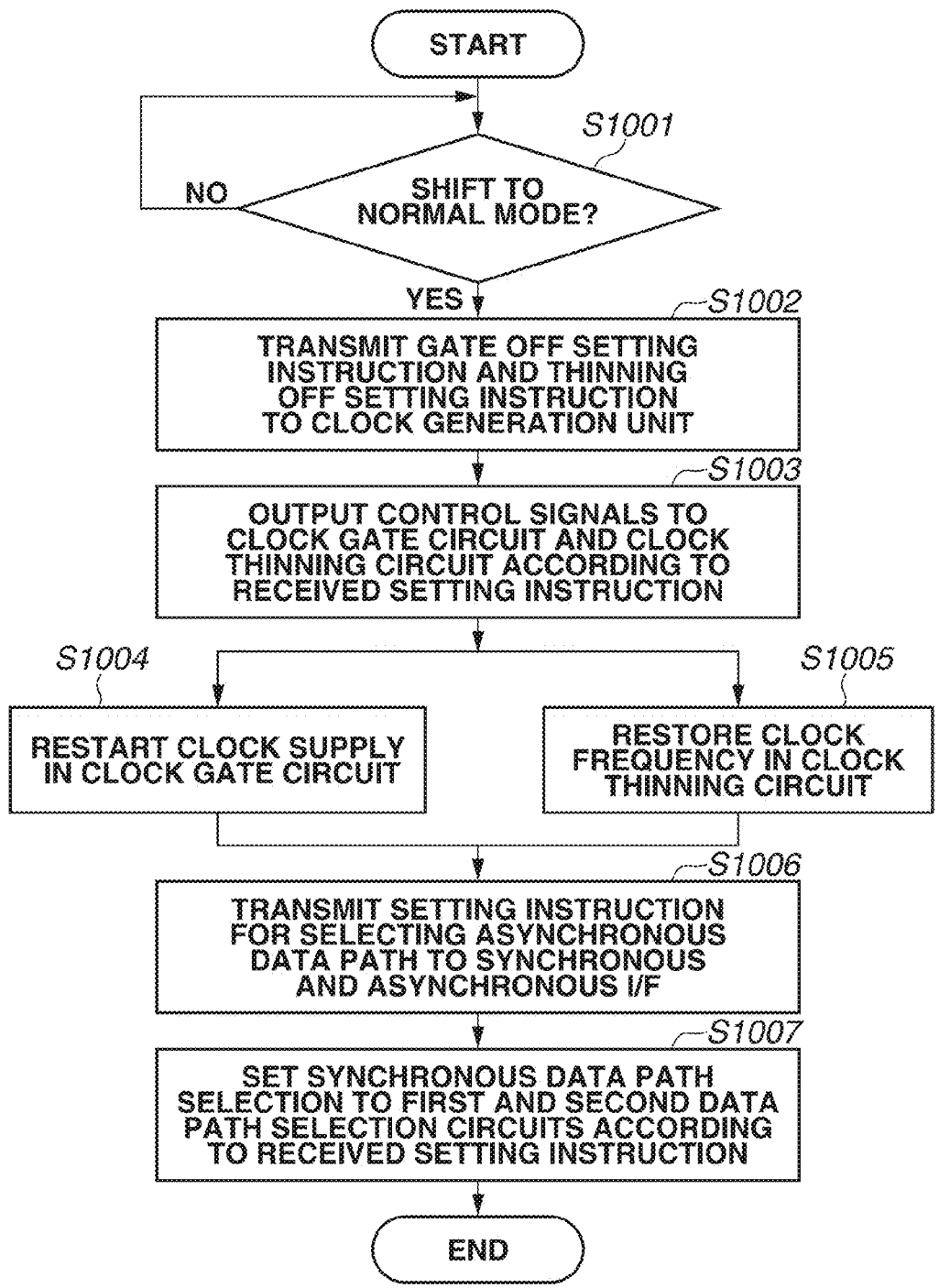
FIG. 10 is a flowchart illustrating a control flow at the time of a return from the power saving mode to the normal mode according to the first exemplary embodiment.

It is necessary to perform data path selection and setting in the flowcharts illustrated in FIGS. 9 and 10 in a state where data transfer is not being performed between the system bus 208 and the DRAM 203. Therefore, when the DRAM 203 is used as a work memory of the CPU 201, control of the above-described flowcharts is implemented, for example, when the CPU 201 processes a program stored in the ROM 204.

Although, in the present exemplary embodiment, the synchronous and asynchronous I/F 214 is an independent functional module, the configuration is not limited thereto. For example, the memory controller 202 may be provided with functions equivalent to the synchronous and asynchronous I/F 214.

Further, in the present exemplary embodiment, although the synchronous and asynchronous I/F 214 is provided between the system bus 208 operating based on a variable-frequency clock and the memory controller 202 operating based on a fixed-frequency clock to smoothly perform data transfer therebetween, the configuration is not limited thereto. In a situation where synchronous and asynchronous data transfer may occur between a functional module operating based on a variable-frequency clock and another functional module operating based on a fixed-frequency clock, providing the above-described synchronous and asynchronous I/F between both the functional modules enables acquiring the same effect.

According to the present exemplary embodiment, as described above, data transfer is possible even when clock edge positions are not matched in a case where a plurality of different types of clocks is not in a synchronous relation. Further, it becomes possible to perform data transfer without delay when these clocks are in a synchronous relation, and perform safe data transfer even when they are in an asynchronous relation.

A second exemplary embodiment will be described below. In the first exemplary embodiment, the data path for synchronous data transfer and the data path for asynchronous data transfer can be selectively changed in data transfer between a fixed-frequency clock and a variable-frequency clock. Both fixed-frequency clocks and variable-frequency clocks are generated by frequency-dividing the clock of the common first clock source 300. Therefore, there exists a timing at which the rising edges of even clocks with different frequencies are matched. Devising a method for generating a clock in the clock generation unit 205 enables handling data transfer between functional modules on a synchronous basis.

However, there is a case where reduced frequencies to be used in the power saving mode are generated by using different clock sources (clock sources with lower frequencies). In this case, it is difficult to generate a clock with a reduced frequency in a synchronous relation to be used in the power saving mode.

The following describes, as the second exemplary embodiment, a mode for smoothly performing data transfer between the functional modules in a case where reduced frequencies in the power saving mode are generated by using different clock sources. Descriptions will be omitted for elements equivalent to those in the first exemplary embodiment (the basic configuration of the image forming apparatus 100 and the internal configuration of the main controller 101). Descriptions will be made focusing on differences from the first exemplary embodiment (the internal configuration of the clock generation unit and operation mode transition control).

<Clock Generation Unit>

Figure 11:
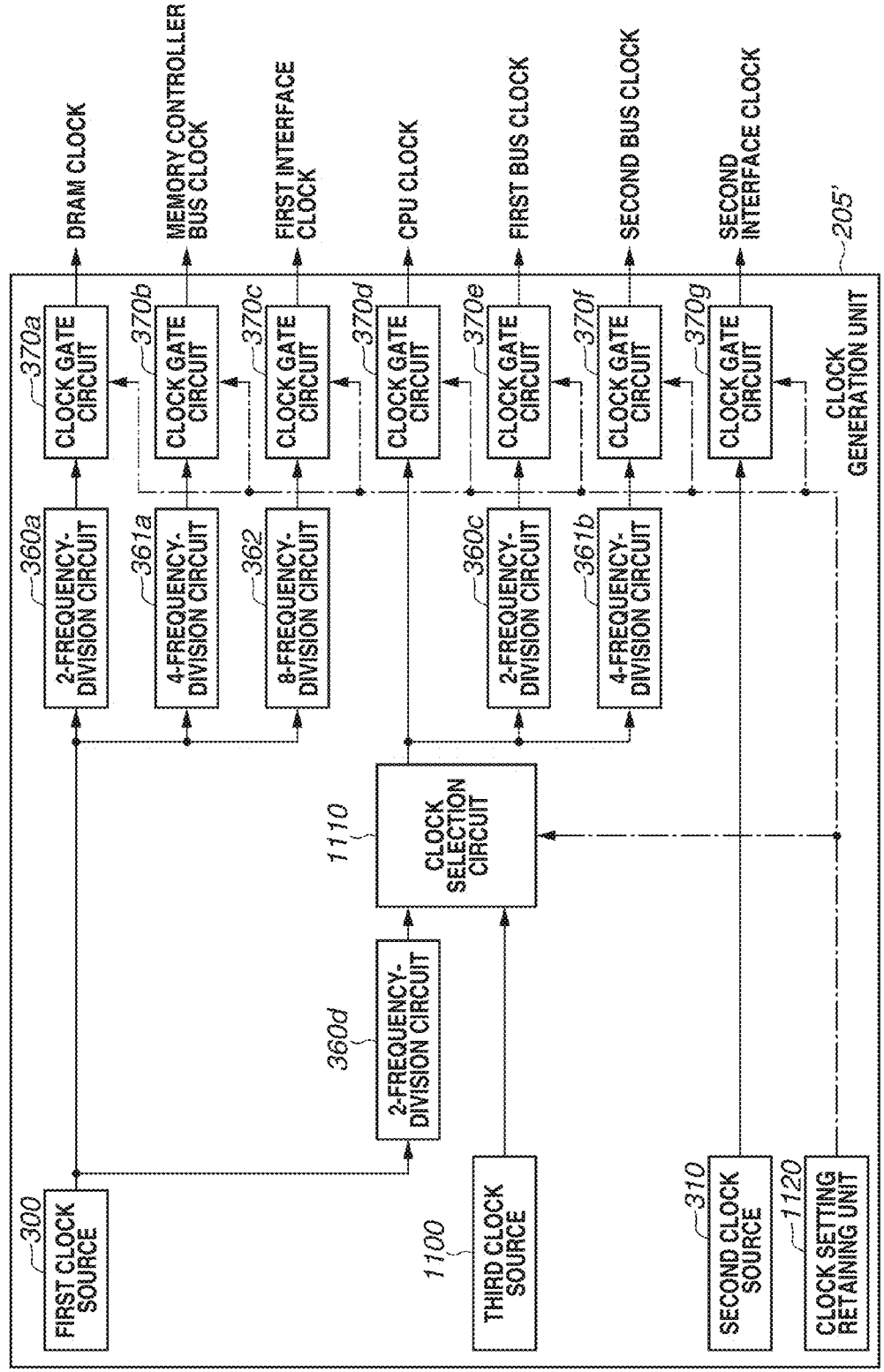
FIG. 11 is a block diagram illustrating an internal configuration of a clock generation unit according to a second exemplary embodiment.

FIG. 11 is a block diagram illustrating an internal configuration of a clock generation unit 205' according to the present exemplary embodiment. In addition to the first clock source 300 and the second clock source 310, the clock generation unit 205' according to the present exemplary embodiment further includes a third clock source 1100. The clock generation unit 205' further includes a clock selection circuit 1110 instead of the clock thinning circuit 320, and a clock setting retaining unit 1120 for setting the clock selection circuit 1110. The clock generation unit 205' further includes a plurality of frequency-division circuits and a plurality of clock gate circuits (the 2-frequency-division circuits 360a, 360c, and 360d, the 4-frequency-division circuits 361a and 361b, the 8-frequency-division circuit 362, and the clock gate circuits 370a to 370g).

Similar to other clock sources, the third clock source 1100 is an oscillator circuit configured with a crystal oscillator or a PLL, and oscillates at a frequency lower than the frequency of the 2-frequency-division clock of the first clock source 300. For example, the frequency of the first clock source 300 is 1600 MHz, the frequency of the second clock source 310 is 20 MHz, and the frequency of the third clock source 1100 is 50 MHz. As above-described, the third clock source 1100 is used when maintaining a low power consumption in the power saving mode.

The clock selection circuit 1110 selects and outputs either the output clock of the 2-frequency-division circuit 360d that frequency-divides the clock of the first clock source 300 or the output clock of the third clock source 1100 based on a clock selection control signal from the clock setting retaining unit 1120 (described below). In the power saving mode, supplying the clock of the third clock source 1100 with a low frequency to functional modules allowed for reduced operation speed enables reducing the power consumption of the image forming apparatus 100 while maintaining the operations of the synchronization circuits of the relevant functional modules.

The clock setting retaining unit 1120 is a circuit for holding the contents of a setting instruction for controlling the clock selection circuit 1110 and the clock gate circuits 370a to 370g and for outputting respective clock control signals (selection control signals and gate control signals). The clock control settings retained by the clock setting retaining unit 1120 are made from the CPU 201 via the system bus 208.

<Clock Switching by Clock Selection Circuit>

The following describes a state transition from a state where a 2-frequency-division clock obtained by frequency-dividing the clock of the first clock source 300 by 2 is selected to a state where the output clock of the third clock source 1100 is selected.

FIG. 12 illustrates a process of a state transition from a state where the clock selection circuit 1110 selects the output clock of the 2-frequency-division circuit 360d that frequency-divides the clock of the first clock source 300 by 2 to a state where it selects the output clock of the third clock source 1100. When a state transition occurs at a timing "Selection Changed" illustrated by dotted lines in FIG. 12, from a state where the 2-frequency-division clock obtained by frequency-dividing the clock of the first clock source 300 by 2 is selected to a state where the output clock of the third clock source 1100 is selected, the frequency of the output clock of the clock selection circuit 1110 is reduced.

Referring to FIG. 12, before the timing "Selection Changed", the clock selected by the clock selection circuit 1110 is the 2-frequency-division clock obtained by frequency-dividing the clock of the first clock source 300 by 2. In this case, the DRAM clock, the memory controller bus clock, the first interface clock, the CPU clock, the first bus clock, and the second bus clock are clocks generated based on the common first clock source 300. Therefore, these clocks are in a synchronous relation, i.e., the rising edges of these clocks are matched at the timing "Selection Changed" illustrated in FIG. 12. Therefore, operations of the synchronization circuits operating based on these clocks are ensured by performing timing design between clocks at which data transfer is performed.

On the other hand, after the timing "Selection Changed" illustrated in FIG. 12, the clock selected by the clock selection circuit 1110 is the output clock of the third clock source 1100. In this case, the above-described clocks generated based on the first clock source 300 and the clocks generated based on the third clock source 1100 (the CPU clock, the first bus clock, and the second bus clock) have different phases and different frequencies, and are mutually in an asynchronous relation. Therefore, circuits operating between these clocks in an asynchronous relation require a synchronization circuit for safely transmitting data without the occurrence of data loss even if a delay occurs in data transfer.

The following describes a state transition from a state where the output clock of the third clock source 1100 is selected to a state where a 2-frequency-division clock obtained by frequency-dividing the clock of the first clock source 300 by 2 is selected.

FIG. 13 illustrates a state transition from a state where the clock selection circuit 1110 selects the output clock of the third clock source 1100 to a state where it selects a 2-frequency-division clock obtained by frequency-dividing the clock of the first clock source 300 by 2. When a state transition occurs at a timing "Selection Changed" illustrated by dotted lines in FIG. 13, from a state where the output clock of the third clock source 1100 is selected to a state where a 2-frequency-division clock obtained by frequency-dividing the clock of the first clock source 300 by 2 is selected, the frequency of the output clock of the clock selection circuit 1110 returns to the normal frequency. Further, at a timing "Edge Matched" illustrated in FIG. 13, the rising edges of fixed-frequency clocks such as the DRAM clock and the rising edges of variable-frequency clocks such as the CPU clock are matched. This returns to a state where all of the clocks other than the second interface clock are in a synchronous state.

<Data Path Control and Clock Control>

Data path control and clock control by the main controller 101 according to the present exemplary embodiment will be described below with reference to the flowchart illustrated in FIG. 14.

Control processing performed at the time of a state transition from the normal mode to the power saving mode will be described below with reference to FIG. 14 first.

Steps 1401 to 1403 are equivalent to steps 901 to 903 in the flowchart illustrated in FIG. 9 according to the first exemplary embodiment. More specifically, in step S1401, the CPU 201 determines whether a cause of a state transition to the power saving mode has occurred. In step S1402, the CPU 201 transmits a setting instruction for selecting the asynchronous data path to the synchronous and asynchronous I/F 214. In step S1403, the CPU 201 selects the asynchronous data path.

In step S1404, the CPU 201 transmits a setting instruction for turning ON the gate of a specific clock and a setting instruction for selecting the output clock of the third clock source 1100 to the clock generation unit 205' via the system bus 208.

In step S1405, the clock setting retaining unit 1120 in the clock generation unit 205' retains the contents of the two different received setting instructions and, at the same time, outputs predetermined control signals. More specifically, the clock setting retaining unit 1120 outputs a gate control signal for tuning ON the gate to the corresponding clock gate circuit, and outputs a control signal for instructing the clock selection circuit 1110 to select the output clock of the third clock source 1100.

Step 1406 is equivalent to step 906 in the flowchart illustrated in FIG. 9 according to the first exemplary embodiment. More specifically, the corresponding clock gate circuit in the clock generation unit 205' turns ON the gate based on the gate control signal from the clock setting retaining unit 1120. This suspends clock supply to the predetermined functional modules which are allowed to stop operation.

In step S1407, based on the selection control signal from the clock setting retaining unit 1120, the clock selection circuit 1110 in the clock generation unit 205' changes the clock to be selected. More specifically, the clock selection circuit 1110 changes from a state where a 2-frequency-division clock obtained by frequency-dividing the clock of the first clock source 300 by 2 is selected to a state where the output clock of the third clock source 1100 is selected. Thus, clocks with reduced frequencies are supplied to predetermined functional modules that are allowed to operate at lower operating speed. This completes the processing for a state transition to the power saving mode.

This completes the description of the control processing performed at the time of a state transition from the normal mode to the power saving mode according to the present exemplary embodiment. This control processing enables performing safe data transfer, without the occurrence of data loss, between the system bus 208 and the memory controller 202.

Control processing performed at the time of a return from the power saving mode to the normal mode will be described below with reference to FIG. 15.

Step 1501 is equivalent to step S1001 in the flowchart illustrated in FIG. 10 according to the first exemplary embodiment. More specifically, in step S1501, the CPU 201 determines whether a cause of a state transition to the normal mode has occurred.

In step S1502, the CPU 201 transmits a setting instruction for turning OFF the gate of a suspended specific clock and a setting instruction for selecting a 2-frequency-division clock obtained by frequency-dividing the clock of the first clock source 300 (the normal frequency clock) to the clock generation unit 205' via the system bus 208.

In step S1503, the clock setting retaining unit 1120 in the clock generation unit 205' retains the contents of the two different received setting instructions and, at the same time, outputs predetermined control signals. More specifically, the clock setting retaining unit 1120 outputs a gate control signal for turning OFF the gate to the corresponding clock gate circuit, and outputs a control signal for instructing the clock selection circuit 1110 to select a 2-frequency-division clock generated based on the first clock source 300.

Step 1504 is equivalent to step S1004 in the flowchart illustrated in FIG. 10 according to the first exemplary embodiment. More specifically, the specific clock gate circuit in the clock generation unit 205' turns OFF the gate based on the gate control signal from the clock setting retaining unit 1120. This control processing restarts clock supply.

In step S1505, based on the selection control signal from the clock setting retaining unit 1120, the clock selection circuit 1110 in the clock generation unit 205' changes the clock to be selected. More specifically, the CPU 201 changes from a state where the output clock of the third clock source 1100 is selected to a state where a 2-frequency-division clock obtained by frequency-dividing the clock of the first clock source 300 by 2 is selected. Thus, clocks with the normal frequencies are output.

Steps S1506 and S1507 are equivalent to steps S1006 and S1007 in the flowchart illustrated in FIG. 10 according to the first exemplary embodiment. More specifically, in step S1506, the CPU 201 transmits a setting instruction for selecting the synchronous data path. In step S1507, the CPU 201 makes setting for selecting the synchronous data path. This completes the processing for returning to the normal mode.

This completes the description of the control processing performed at the time of a return from the power saving mode to the normal mode according to the present exemplary embodiment. Thus, it becomes possible to perform clock-synchronous data transfer without delay between the system bus 208 and the memory controller 202.

According to the present exemplary embodiment, as described above, in the normal mode, it becomes possible to perform synchronous data transfer without delay based on a plurality of clocks in a synchronous relation by using a single clock source. In the power saving mode, it becomes possible to perform safe data transfer based on clocks in an asynchronous relation while reducing the power consumption, by using an independent clock source with a lower frequency.

Other Embodiments

Embodiments can also be realized by a computer of a system or apparatus that reads out and executes computer executable instructions recorded on a storage medium (e.g., non-transitory computer-readable storage medium) to perform the functions of one or more of the above-described embodiment(s), and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-190384, filed Sep. 18, 2014, which is hereby incorporated by reference herein in its entirety.

What is claimed is:

1. A semiconductor integrated circuit comprising:
a fixed frequency-division clock generation unit configured to generate a fixed frequency-division clock with a fixed frequency based on an output clock of a clock source;
a variable frequency-division clock generation unit configured to generate a variable frequency-division clock with a variable frequency based on the output clock of the clock source; and
a data path selection unit configured to select a data path as a data path for transferring data between a first functional module operating based on the fixed frequency-division clock and a second functional module operating based on the variable frequency-division clock,
wherein, while the variable frequency-division clock is generated by the variable frequency-division clock generation unit, the data path selection unit selects a data path using a synchronization unit for converting the data into clock-synchronous data on a receiving side, and
wherein, while the variable frequency-division clock is not generated by the variable frequency-division clock generation unit, the data path selection unit selects a data path without using the synchronization unit.

2. The semiconductor integrated circuit according to claim 1, wherein the variable frequency-division clock generation unit generates a thinned-out clock in which toggles are thinned out from the output clock of the clock source, and generates the variable frequency-division clock based on the thinned-out clock.

3. The semiconductor integrated circuit according to claim 1, wherein the first functional module is a memory controller for controlling a DRAM.

4. A semiconductor integrated circuit comprising:
a fixed frequency-division clock generation unit configured to generate a fixed frequency-division clock with a fixed frequency based on an output clock of a first clock source;
a variable frequency-division clock generation unit configured to generate a variable frequency-division clock with a variable frequency by selecting either a clock based on the first clock source or a clock based on a second clock source for outputting a clock with a frequency lower than the frequency of the clock based on the first clock source; and
a data path selection unit configured to select a data path as a data path for transferring data between a first functional module operating based on the fixed frequency-division clock and a second functional module operating based on the variable division clock,
wherein, while the variable frequency-division clock is generated by the variable frequency-division clock generation unit, the data path selection unit selects a data path using a synchronization unit for converting the data into clock-synchronous data on a receiving side, and
wherein, while the variable frequency-division clock is not generated by the variable frequency-division clock generation unit, the data path selection unit selects a data path without using the synchronization unit.

5. The semiconductor integrated circuit according to claim 4, wherein the clock based on the first clock source is a first output clock of the first clock source or a frequency-division clock generated based on the first output clock, and
wherein the clock based on the second clock source is a second output clock of the second clock source or a frequency-division clock generated based on the second output clock.

6. The semiconductor integrated circuit according to claim 4, wherein, in a case where the variable frequency-division clock generation unit selects the clock based on the second clock source, the fixed frequency-division clock generated based on the output clock of the first clock source and the variable frequency-division clock generated based on the clock based on the second clock source are in an asynchronous relation.

7. The semiconductor integrated circuit according to claim 4, wherein the first functional module is a memory controller for controlling a Dynamic Random Access Memory (DRAM).

8. A clock control method in a semiconductor integrated circuit, the method comprising:
generating a fixed frequency-division clock with a fixed frequency based on an output clock of a clock source;
generating a variable frequency-division clock with a variable frequency based on the output clock of the clock source; and
selecting a data path as a data path for transferring data between a first functional module operating based on the fixed frequency-division clock and a second functional module operating based on the variable frequency-division clock,
wherein, while the variable frequency-division clock is generated by the generating a variable frequency-division clock, the selecting selects a data path using a synchronization unit for converting the data into clock-synchronous data on a receiving side, and wherein, while the variable frequency-division clock is not generated by the generating a variable frequency-division clock, the selecting selects a data path without using the synchronization unit.

9. A clock control method in a semiconductor integrated circuit, the method comprising:

generating a fixed frequency-division clock with a fixed frequency based on an output clock of a first clock source;

generating a variable frequency-division clock with a variable frequency by selecting either a clock based on the first clock source or a clock based on a second clock source for outputting a clock with a frequency lower than the frequency of the clock based on the first clock source; and selecting a data path as a data path for transferring data between a first functional module operating base on the fixed frequency-division clock and a second functional module operating based on the variable frequency-division clock, wherein, while the variable frequency-division clock is generated by the generating a variable frequency-division clock, the selecting selects a data path using a synchronization unit for converting the data into clock-synchronous data on a receiving side, and wherein, while the variable frequency-division clock is not generated by the generating a variable frequency-division clock, the selecting selects a data path without using the synchronization unit.

* * * * *